US010868127B2

(12) United States Patent
Cheng et al.

(10) Patent No.: US 10,868,127 B2
(45) Date of Patent: Dec. 15, 2020

(54) GATE-ALL-AROUND STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Chao-Ching Cheng, Hsinchu (TW);
Yu-Lin Yang, Hsinchu County (TW);
I-Sheng Chen, Taipei (TW);
Tzu-Chiang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/798,228

(22) Filed: Oct. 30, 2017

(65) Prior Publication Data

US 2019/0131415 A1 May 2, 2019

(51) Int. Cl.
*H01L 29/66* (2006.01)
*H01L 29/423* (2006.01)
*H01L 29/78* (2006.01)
*H01L 29/06* (2006.01)
*H01L 29/10* (2006.01)
*H01L 29/786* (2006.01)

(52) U.S. Cl.
CPC .... *H01L 29/42356* (2013.01); *H01L 29/0673* (2013.01); *H01L 29/1033* (2013.01);
(Continued)

(58) Field of Classification Search
CPC ......... H01L 29/42356; H01L 29/66795; H01L 29/1033; H01L 29/785; H01L 29/0673;
H01L 27/0924; H01L 21/31051; H01L 27/0207; H01L 29/0649; H01L 21/32115; H01L 21/823828; H01L 29/66681; H01L 21/823821; H01L 29/0657; H01L 29/4966; H01L 29/0882; H01L 29/66545; H01L 29/4983; H01L 29/1037; H01L 29/0653; H01L 29/66659; H01L 29/7835; H01L 29/66689; H01L 29/7816; H01L 21/28088;
(Continued)

(56) References Cited

U.S. PATENT DOCUMENTS 8,536,029 B1 * 9/2013 Chang .................. H01L 21/845
257/29
9,209,247 B2 12/2015 Colinge et al.
(Continued)

OTHER PUBLICATIONS

U.S. Office Action for U.S. Appl. No. 16/681,102 dated Oct. 14, 2020.

*Primary Examiner* — Moin M Rahman
(74) *Attorney, Agent, or Firm* — Birch, Stewart, Kolasch & Birch LLP

(57) ABSTRACT

Present disclosure provides gate-all-around structure including a first transistor. The first transistor includes a semiconductor substrate having a top surface, a first nanowire over the top surface of the semiconductor substrate and between a first source and a first drain, a first gate structure around the first nanowire, an inner spacer between the first gate structure and the first source and first drain, and an isolation layer between the top surface of the semiconductor substrate and the first source and the first drain. Present disclosure also provides a method for manufacturing the gate-all-around structure described herein.

20 Claims, 26 Drawing Sheets

(52) U.S. Cl.
CPC .. *H01L 29/42392* (2013.01); *H01L 29/66439* (2013.01); *H01L 29/66545* (2013.01); *H01L 29/66742* (2013.01); *H01L 29/66795* (2013.01); *H01L 29/785* (2013.01); *H01L 29/78684* (2013.01); *H01L 29/78696* (2013.01)

(58) Field of Classification Search
CPC ........... H01L 21/823431; H01L 21/845; H01L 27/0886; H01L 27/10826; H01L 27/10879; H01L 27/1211; H01L 29/41791; H01L 2924/13067
See application file for complete search history.

(56) References Cited

U.S. PATENT DOCUMENTS

| | | | |
|---|---|---|---|
| 9,219,154 B1* | 12/2015 | Cheng | H01L 29/7853 |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,853,114 B1* | 12/2017 | Rodder | H01L 29/045 |
| 2011/0079857 A1* | 4/2011 | Lee | H01L 21/823807 257/369 |
| 2013/0105906 A1 | 5/2013 | Yin et al. | |
| 2015/0104918 A1* | 4/2015 | Liu | H01L 29/42392 438/283 |
| 2015/0340457 A1* | 11/2015 | Xie | H01L 29/66545 257/288 |
| 2016/0027871 A1* | 1/2016 | Oxland | H01L 21/0245 257/347 |
| 2016/0240652 A1 | 8/2016 | Ching et al. | |
| 2016/0365411 A1* | 12/2016 | Yeh | H01L 29/0673 |
| 2017/0040321 A1* | 2/2017 | Mitard | H01L 29/78684 |

\* cited by examiner

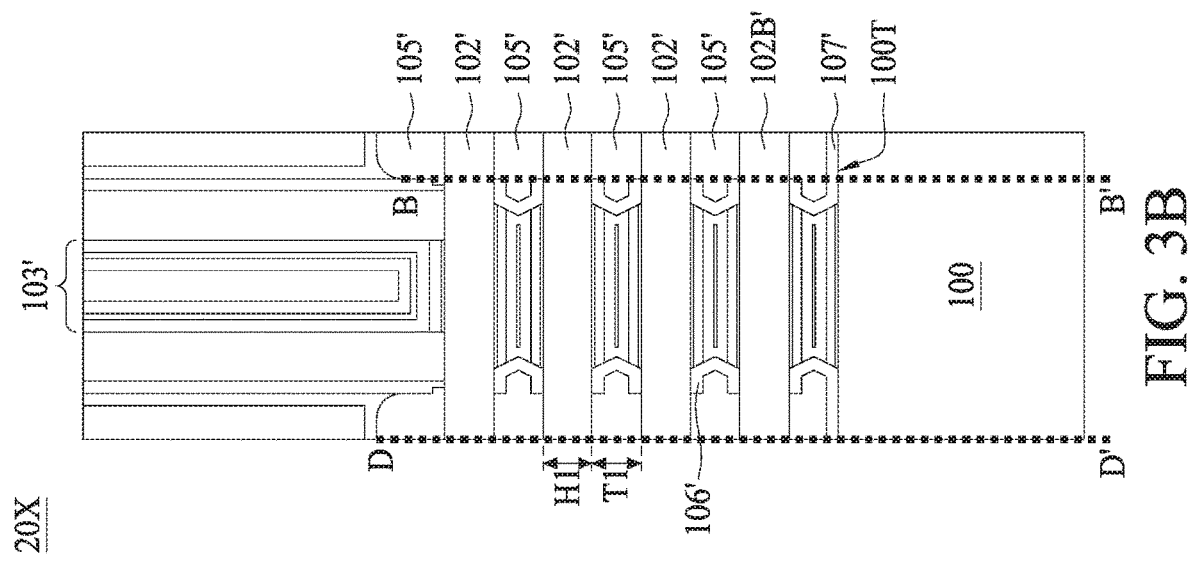
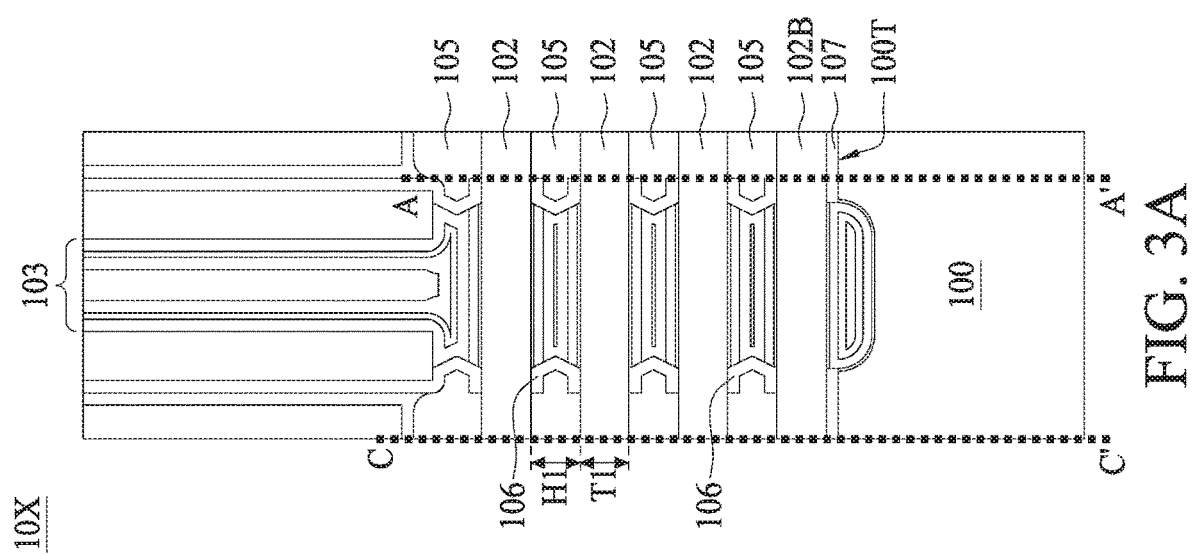
FIG. 3A
FIG. 3B

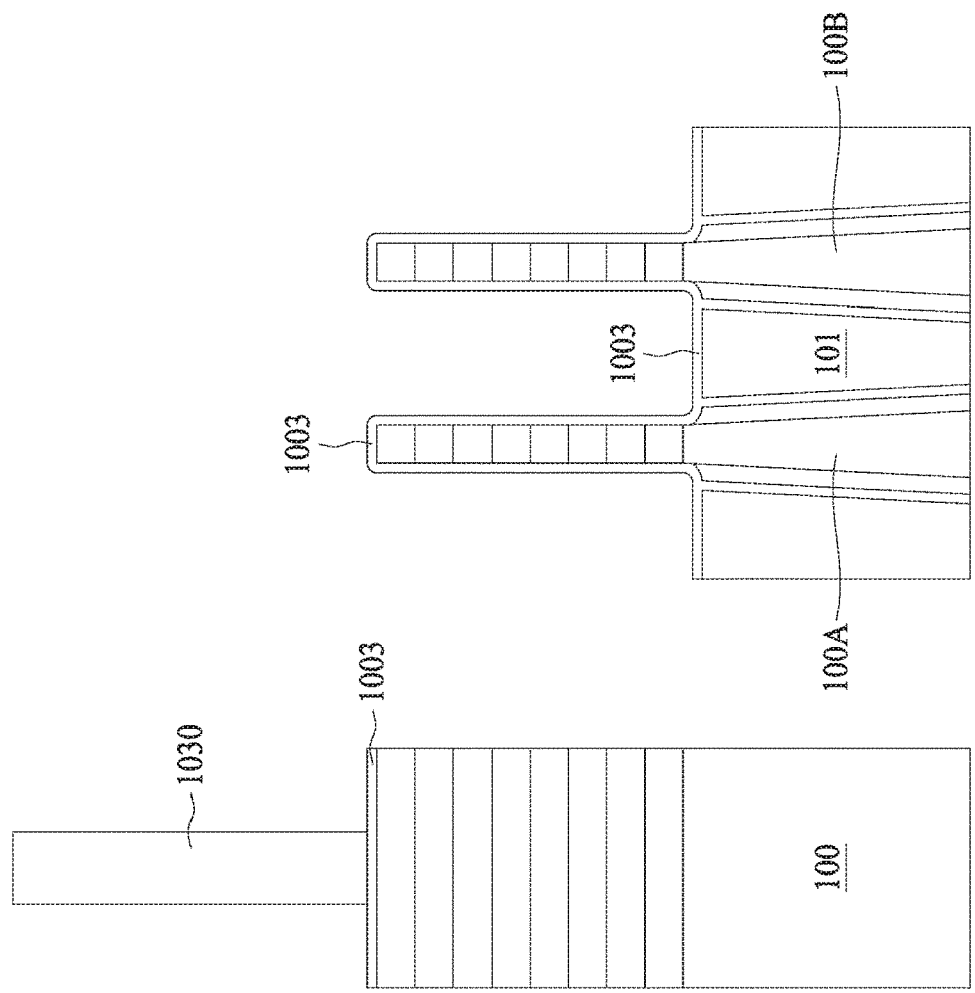
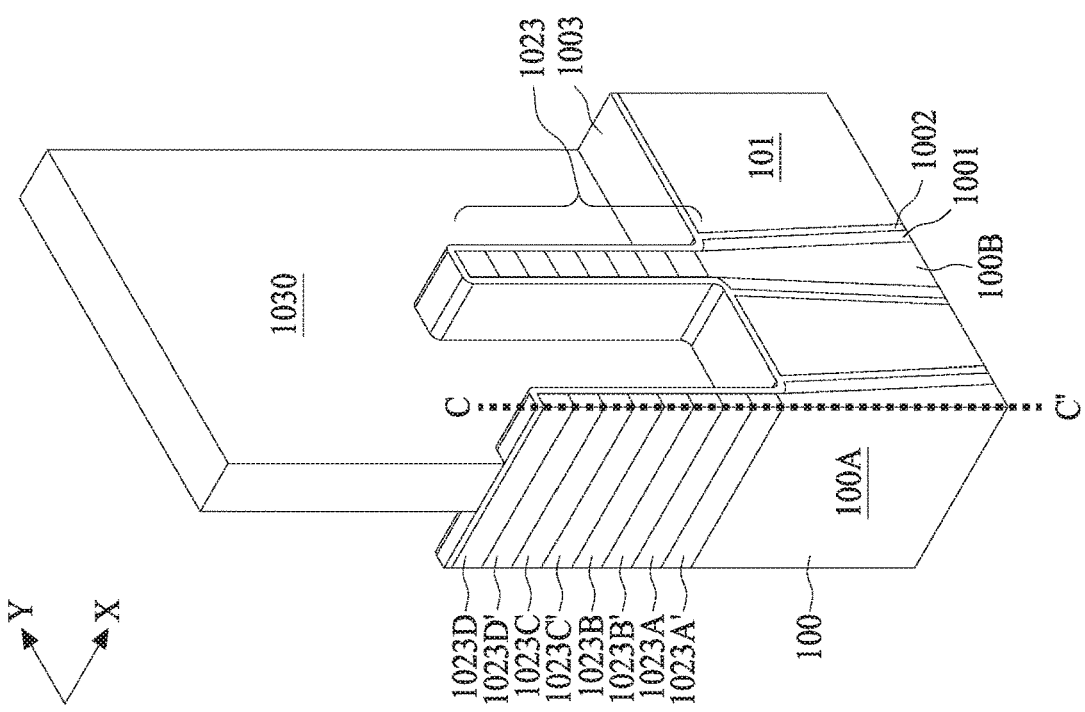
FIG. 6A
FIG. 6B
FIG. 6C

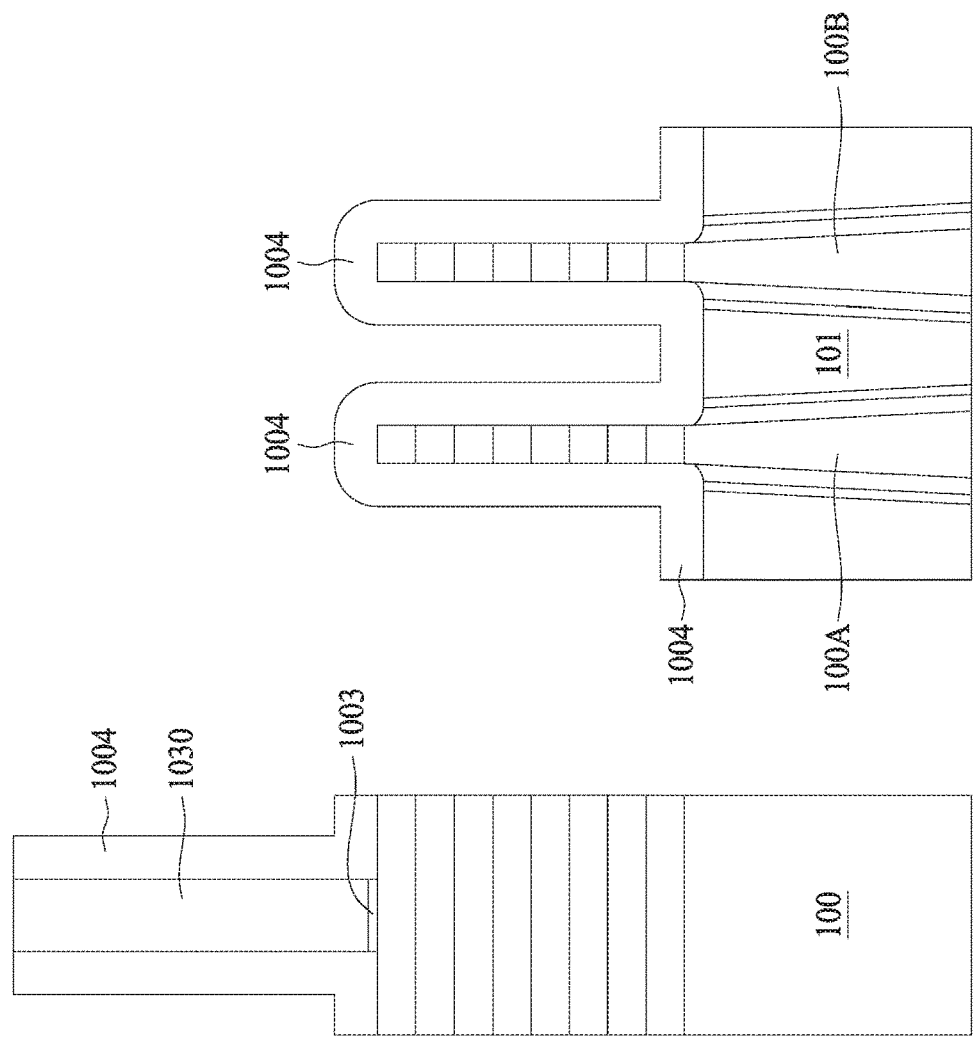
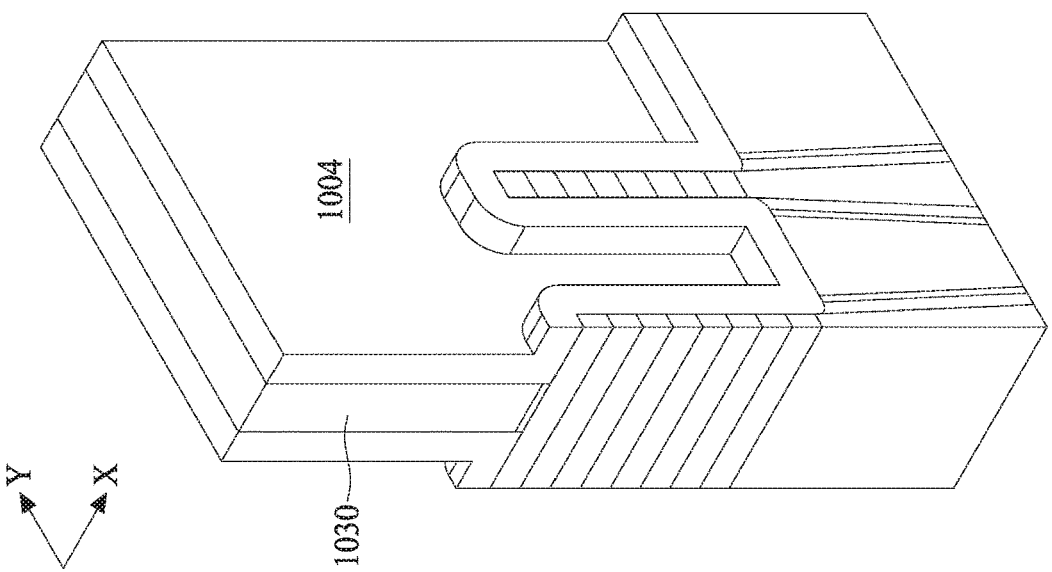
FIG. 8A  FIG. 8B  FIG. 8C

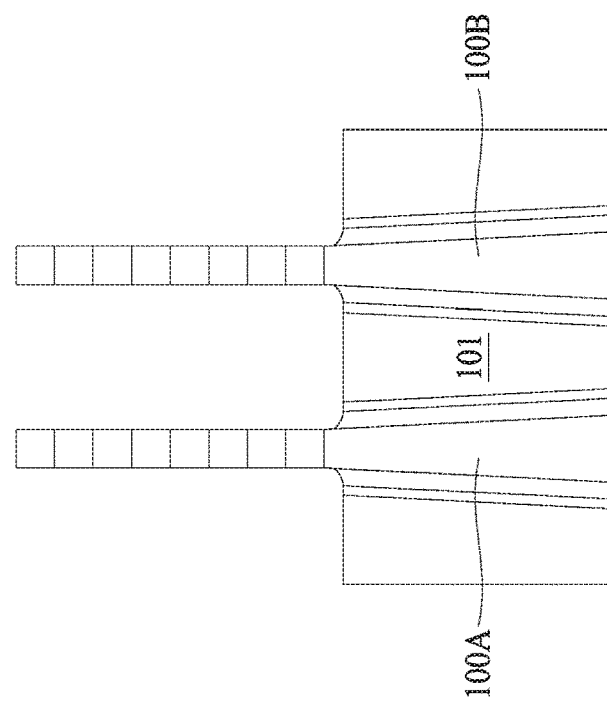
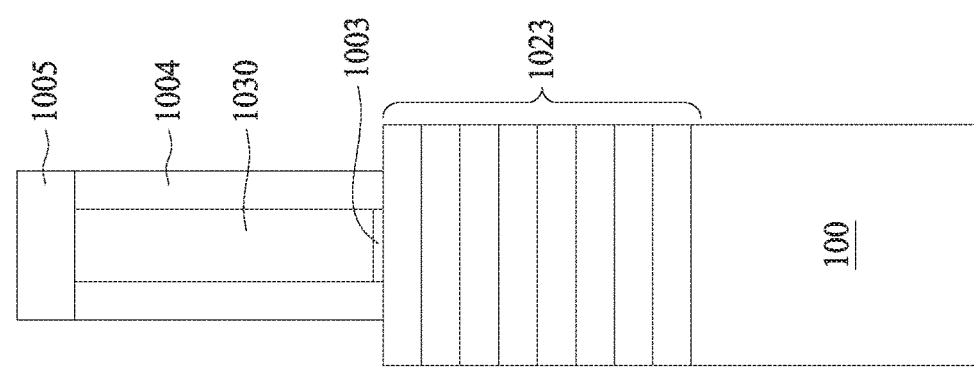
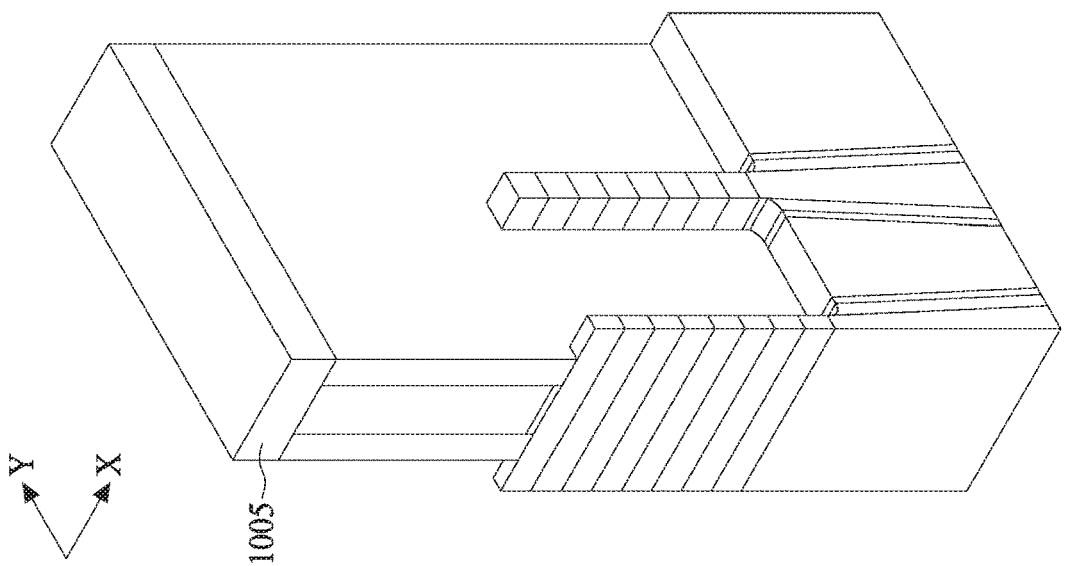

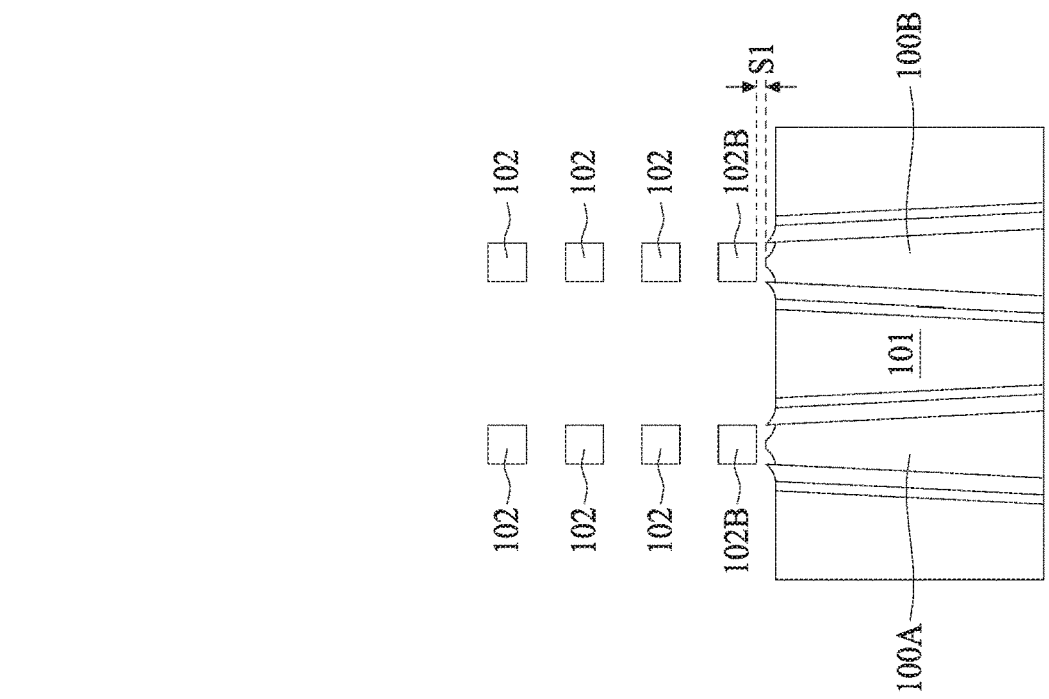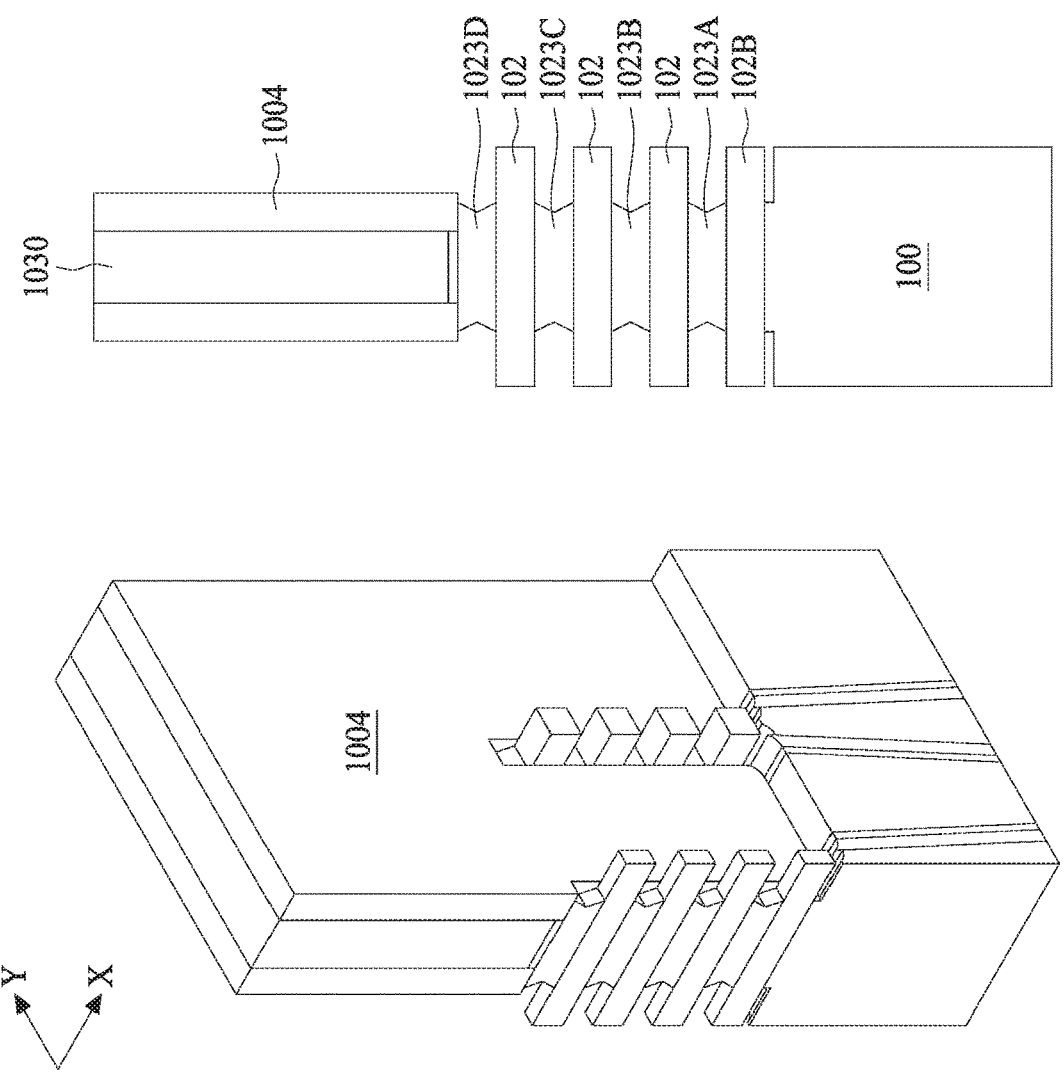

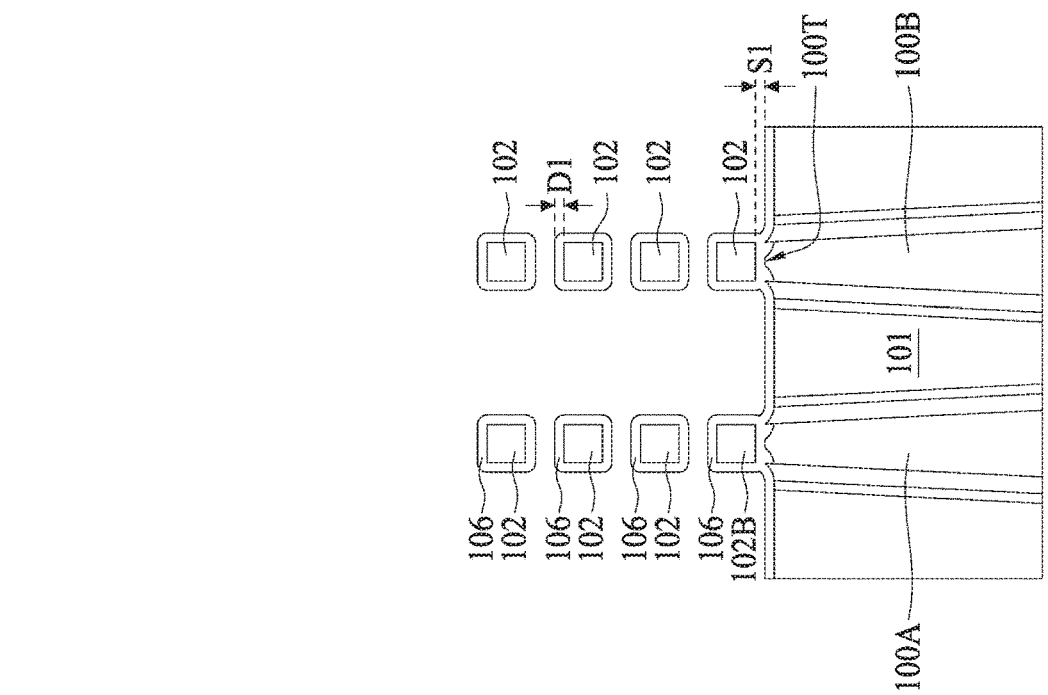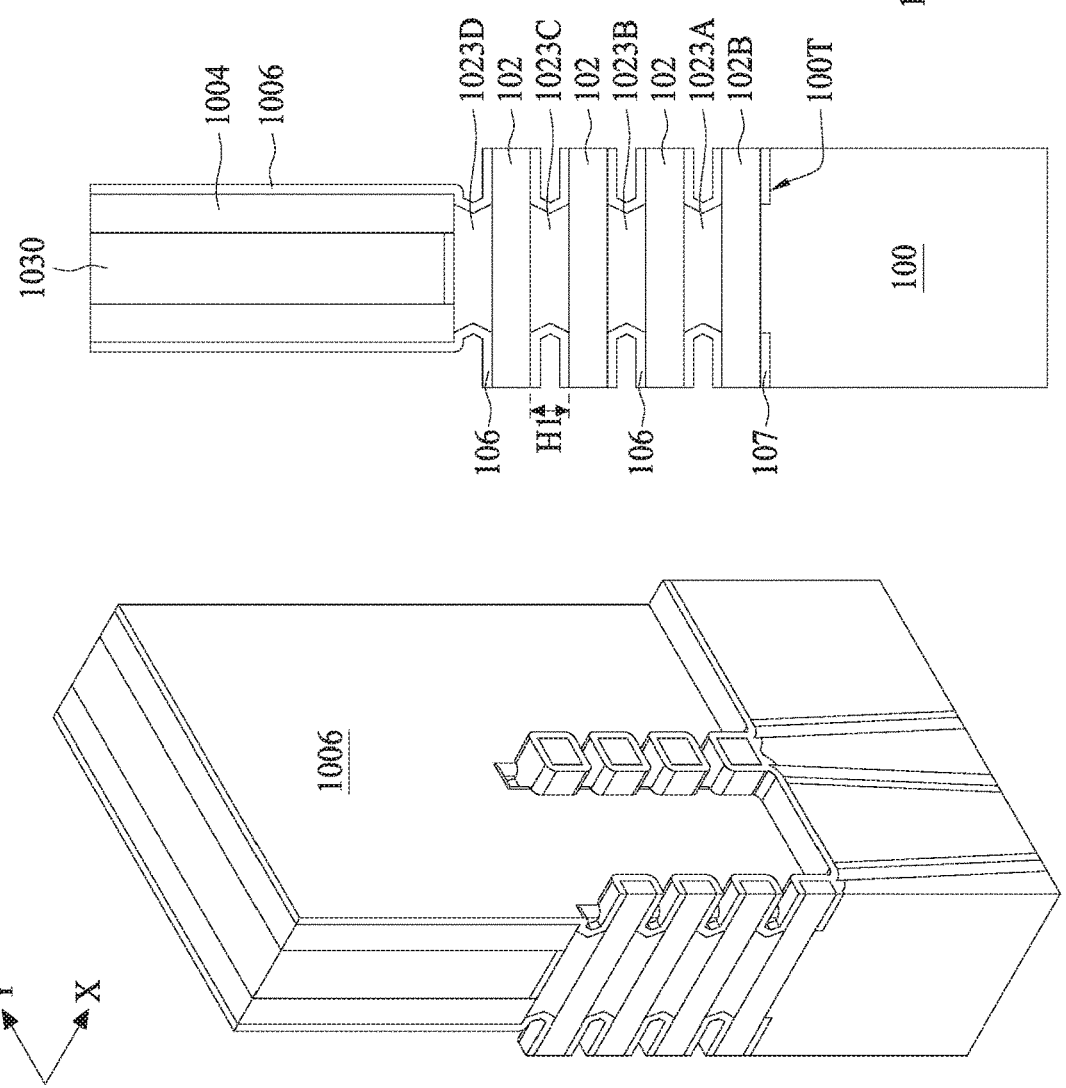

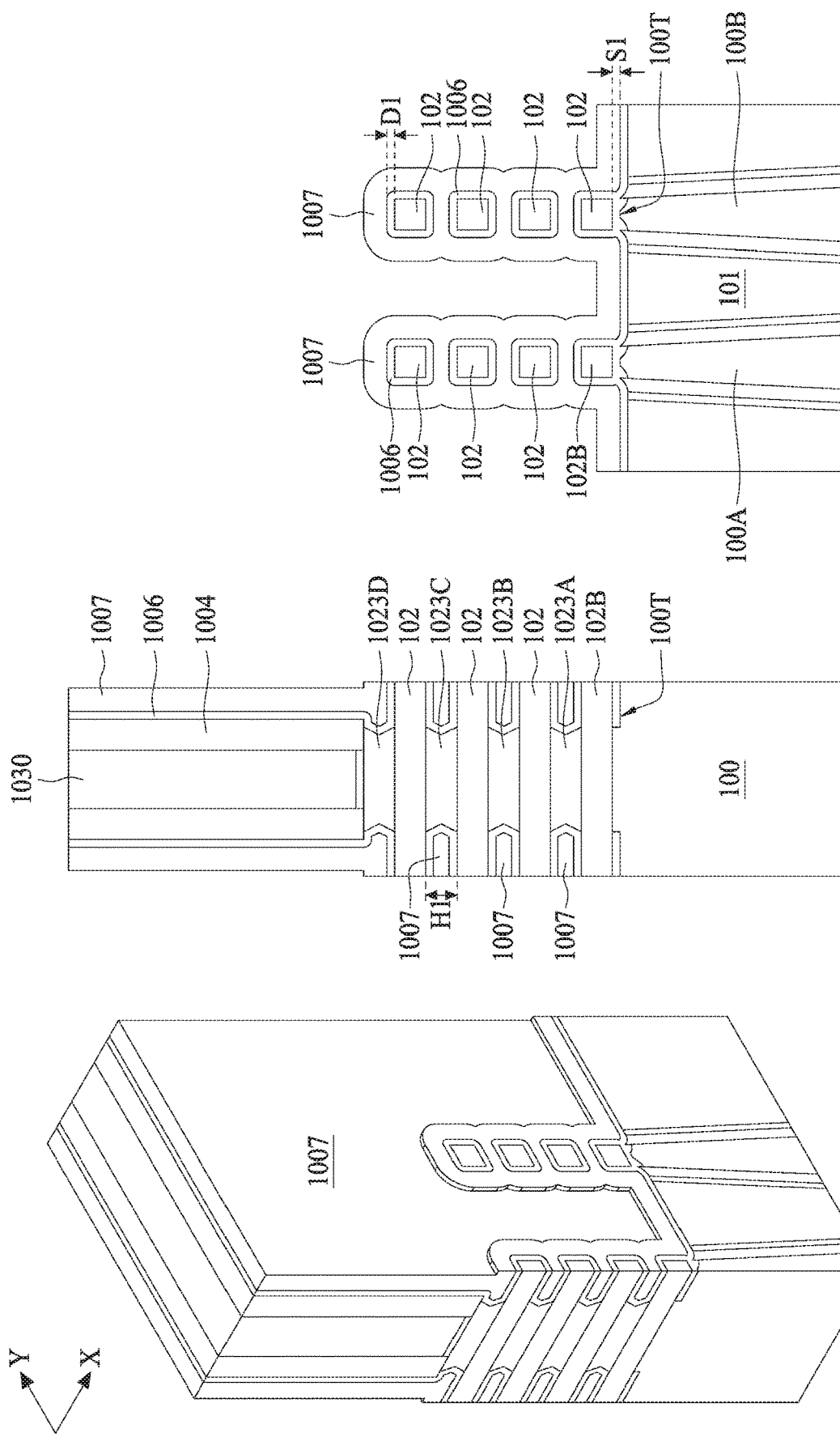

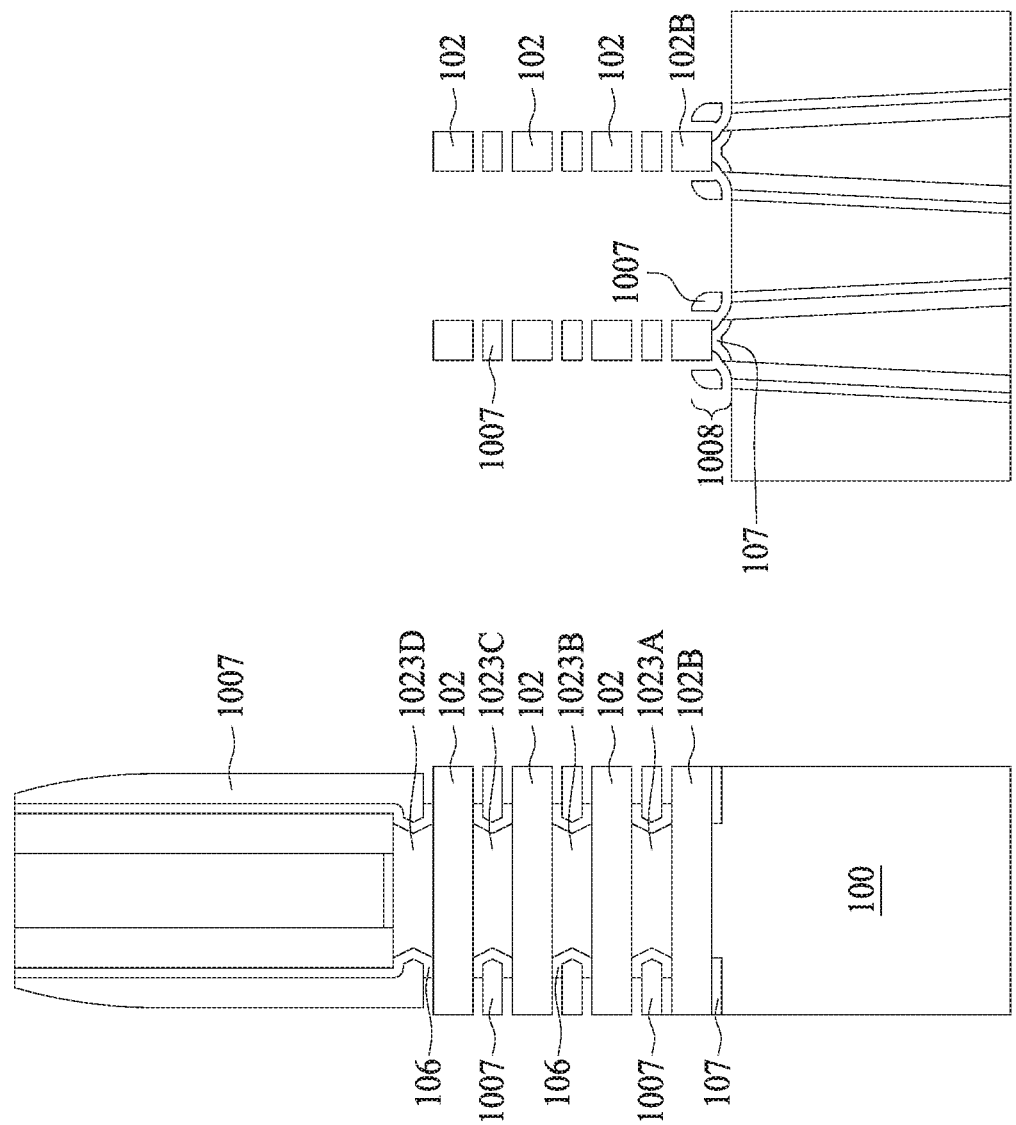
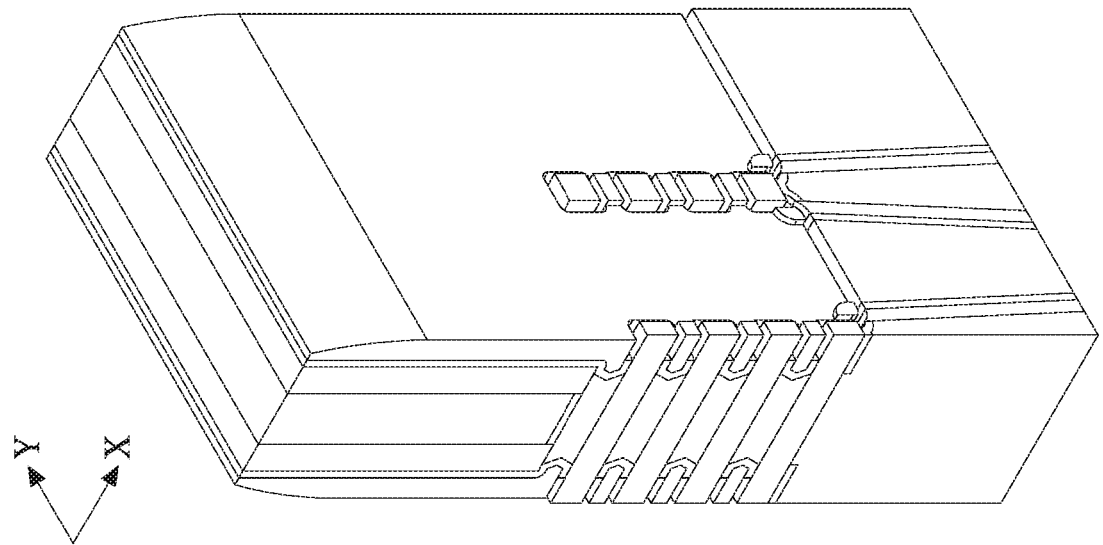
FIG. 14C
FIG. 14B
FIG. 14A

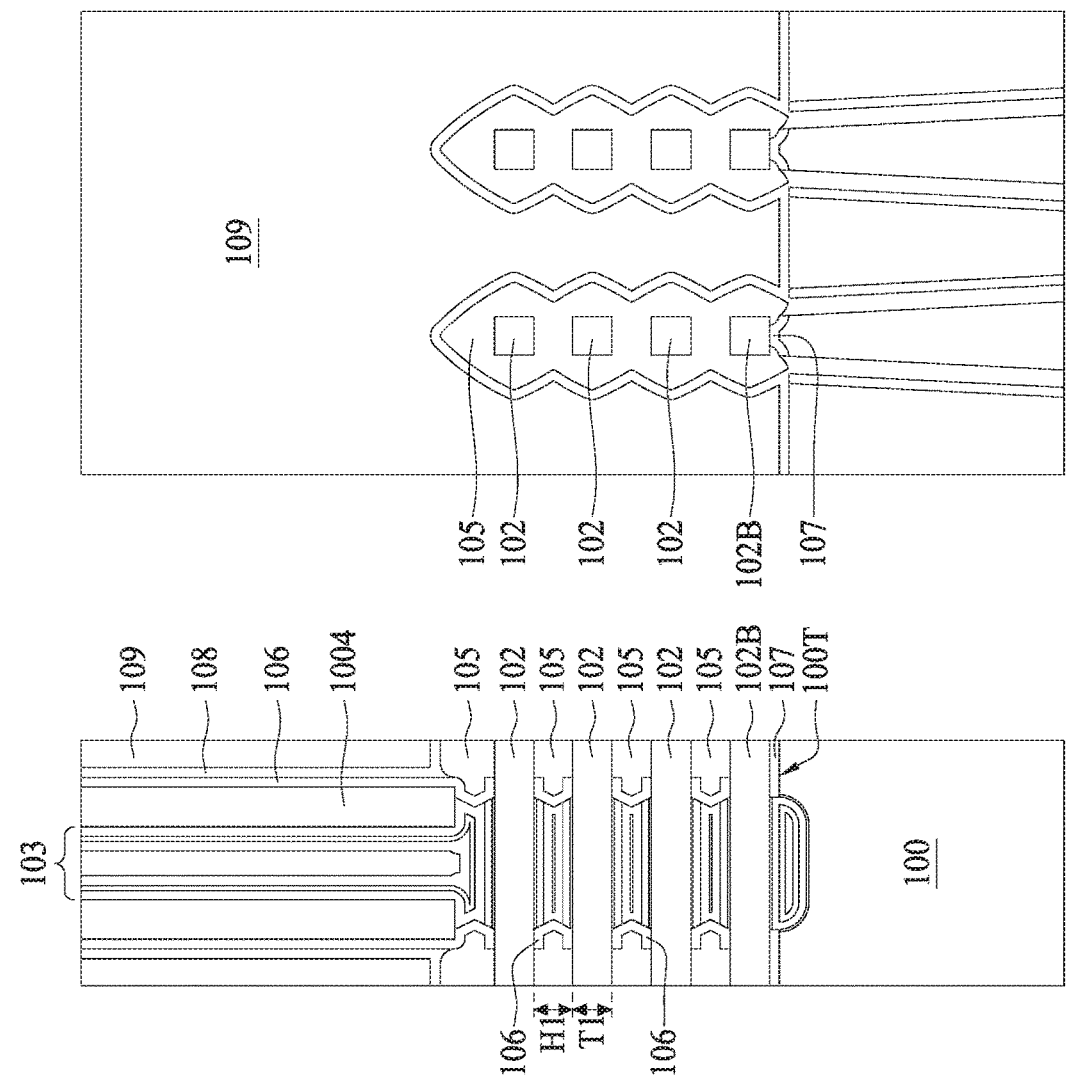
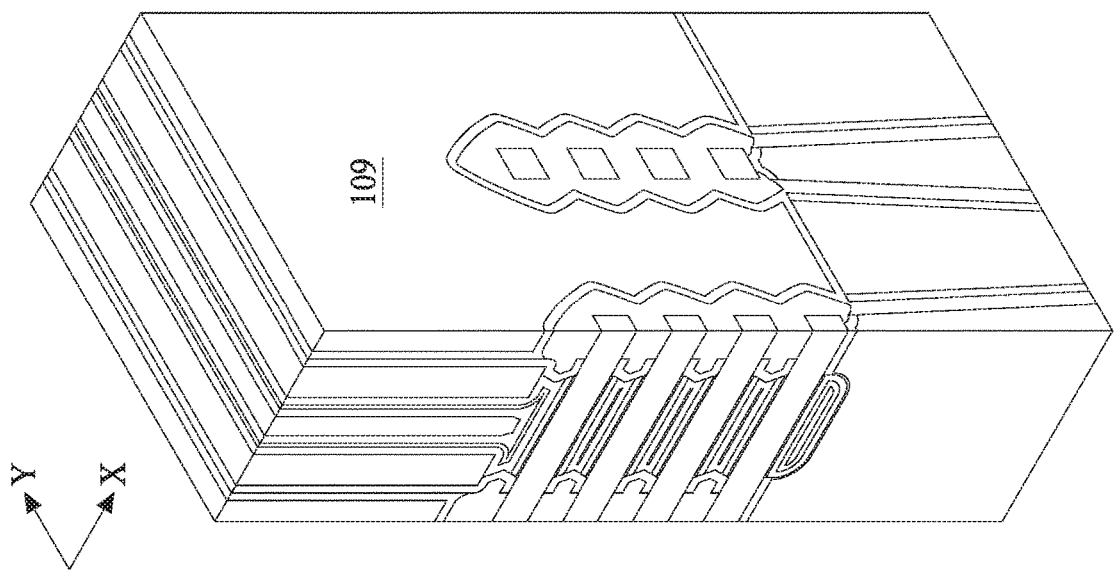
FIG. 17A
FIG. 17B
FIG. 17C

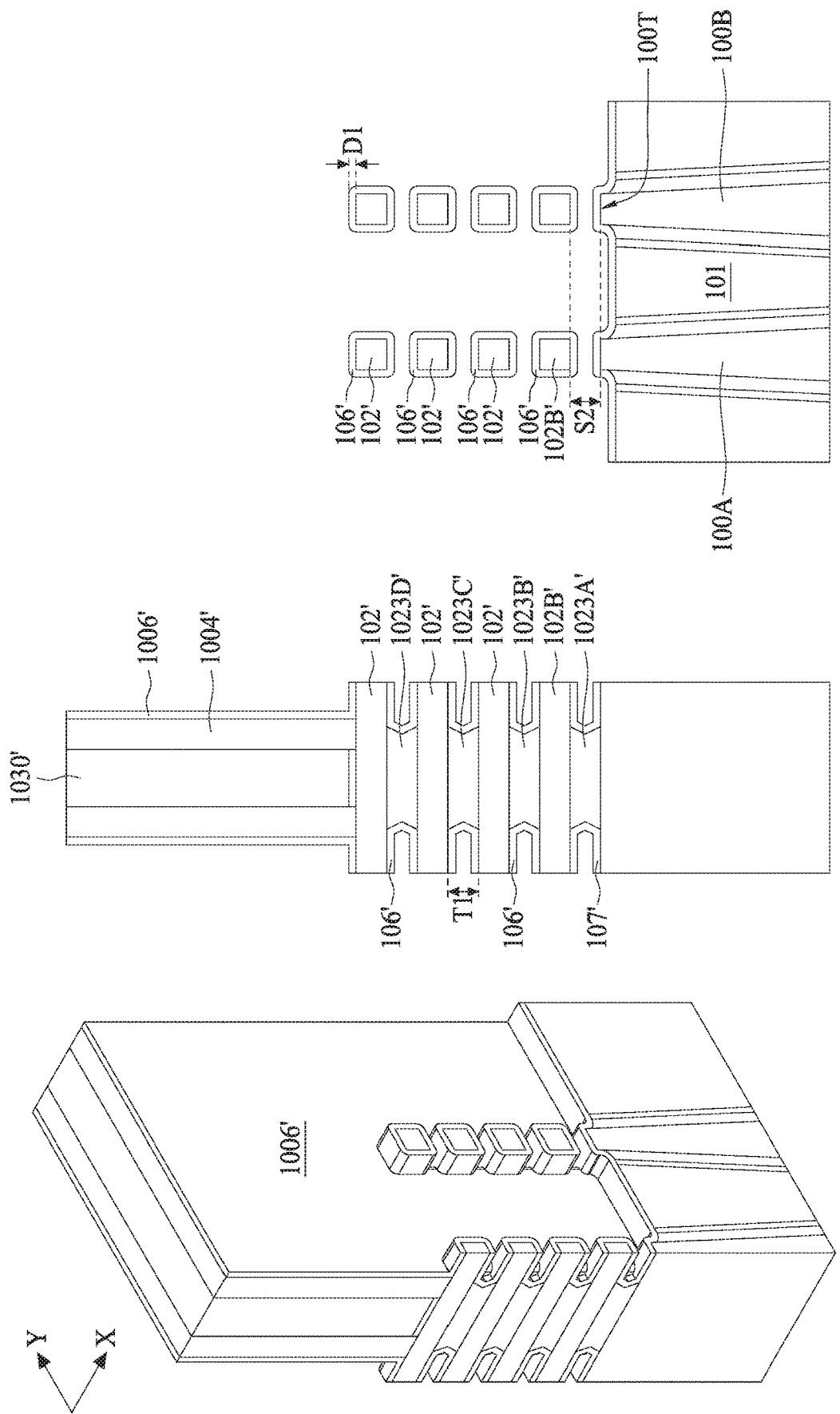

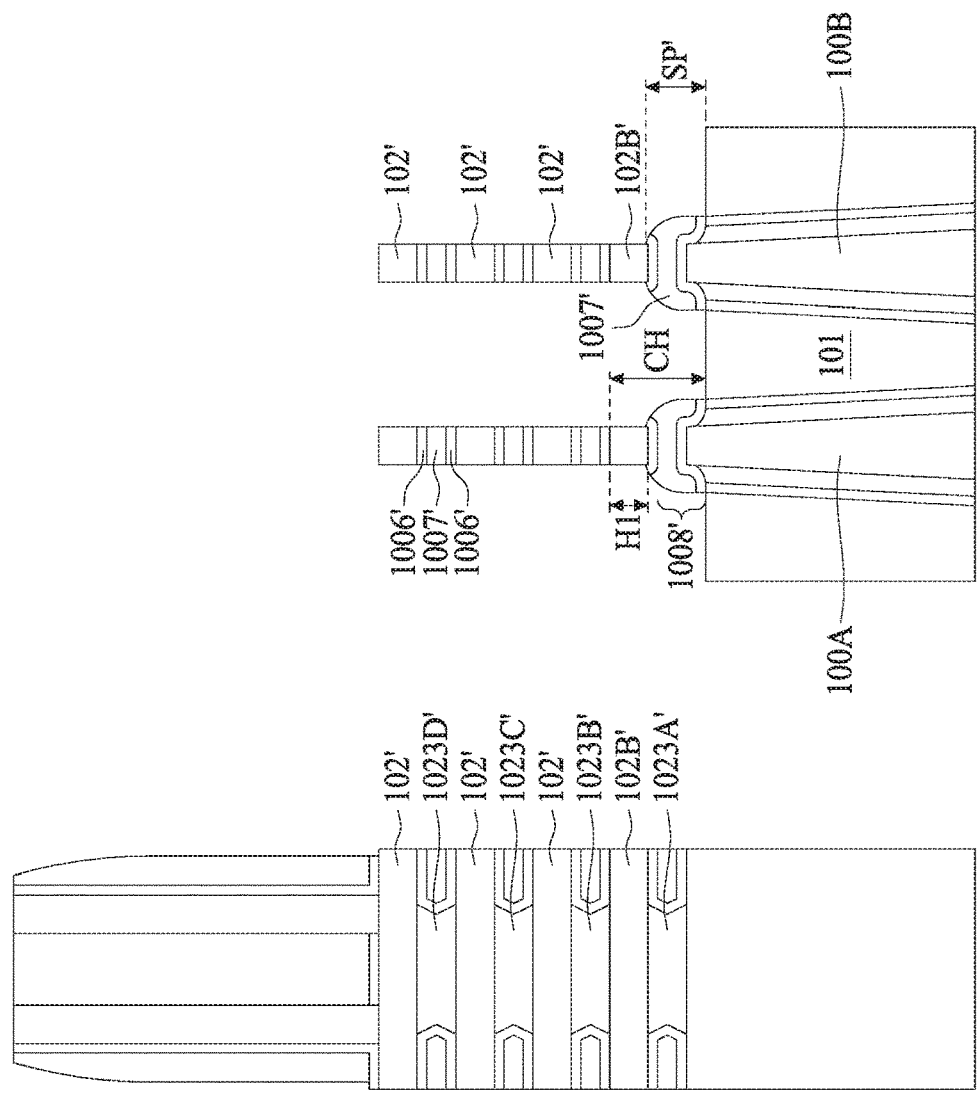
FIG. 21C
FIG. 21B
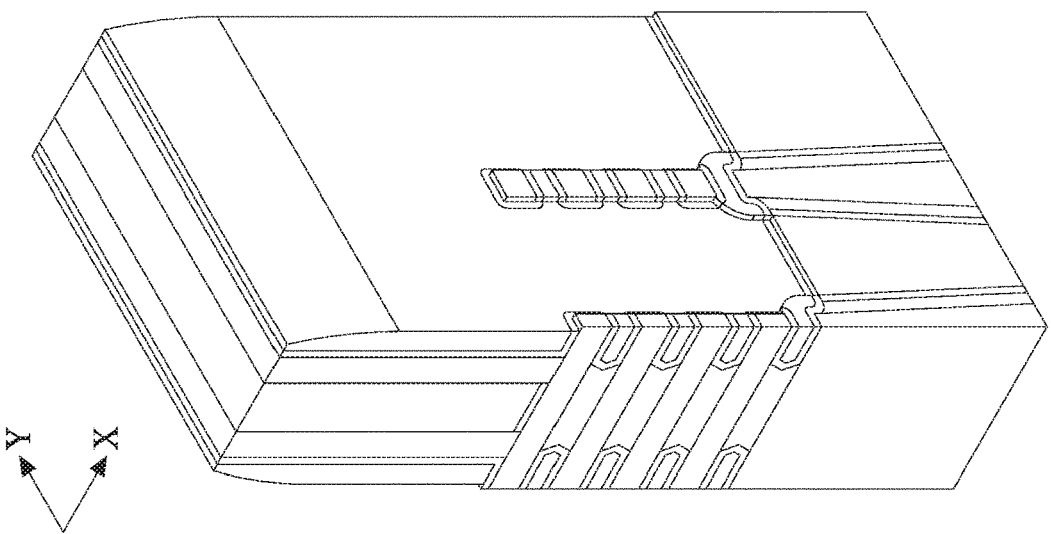
FIG. 21A

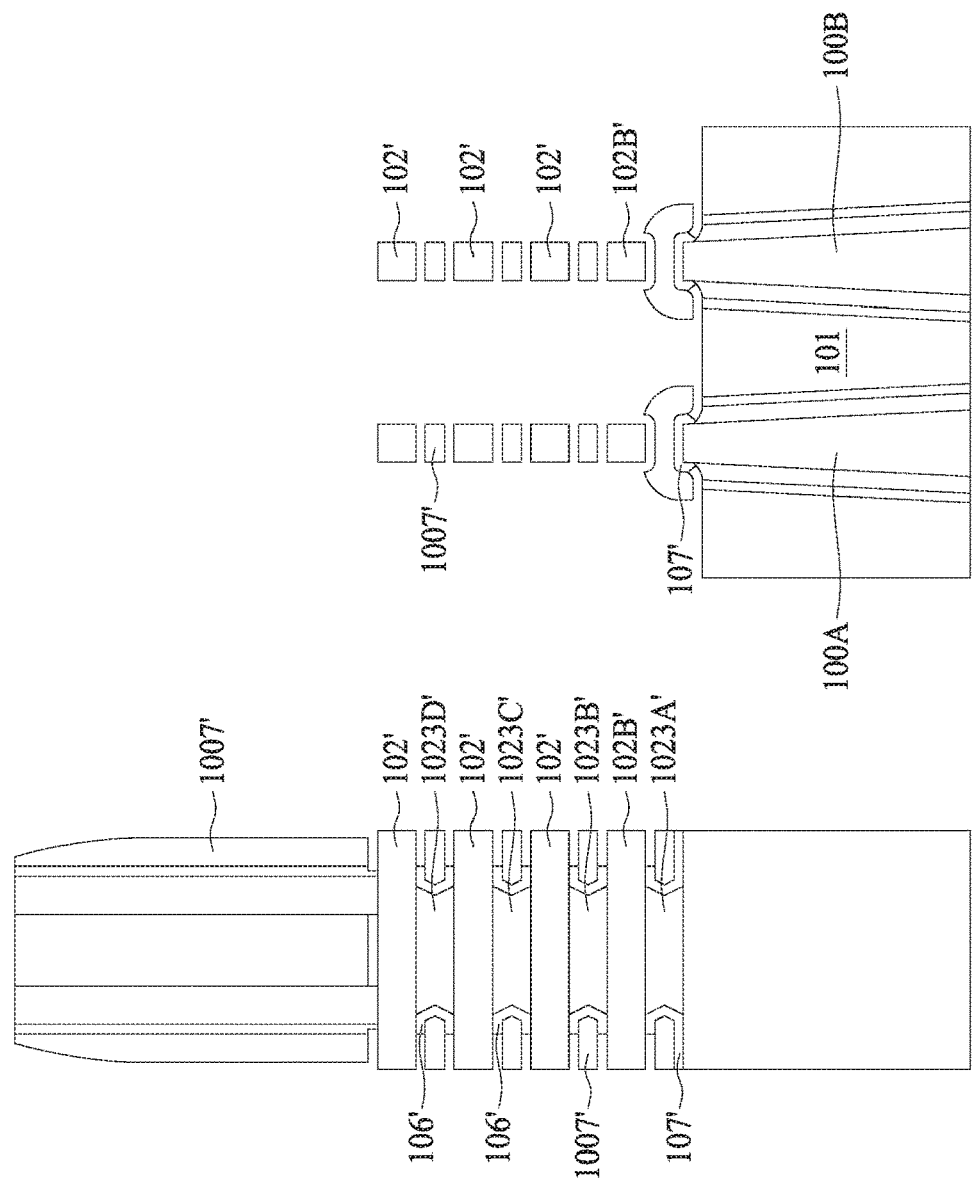
FIG. 22C
FIG. 22B
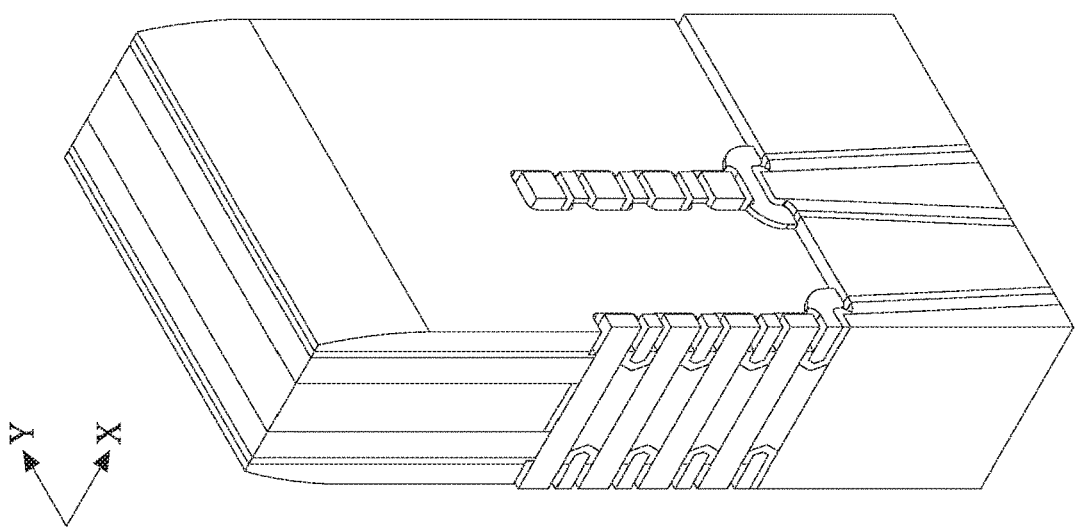
FIG. 22A

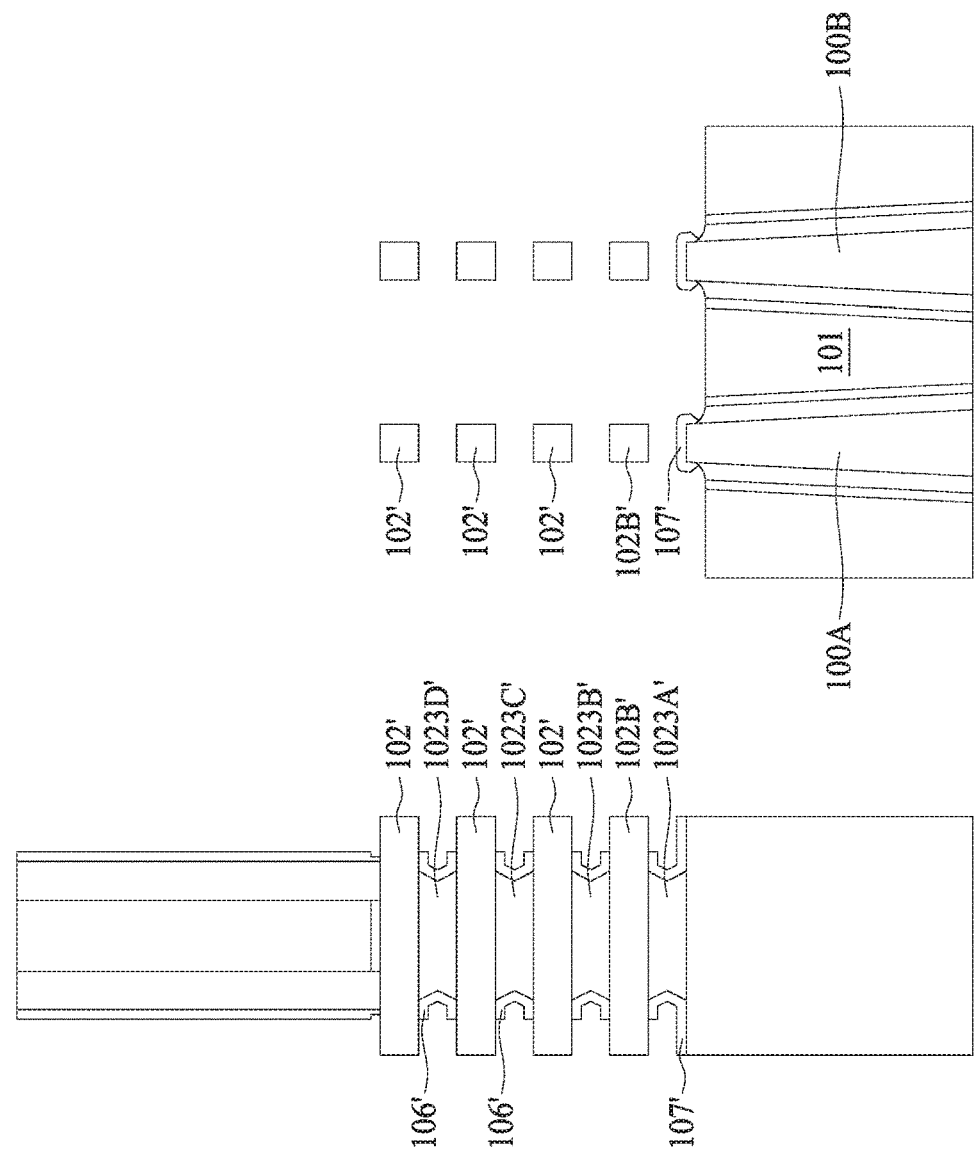
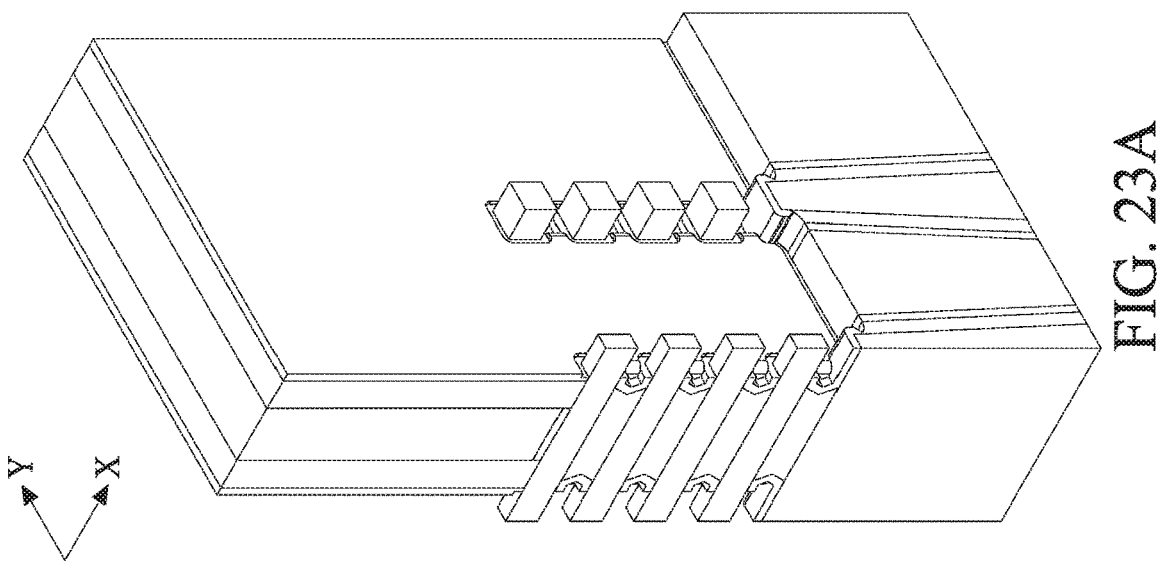
FIG. 23C
FIG. 23B
FIG. 23A

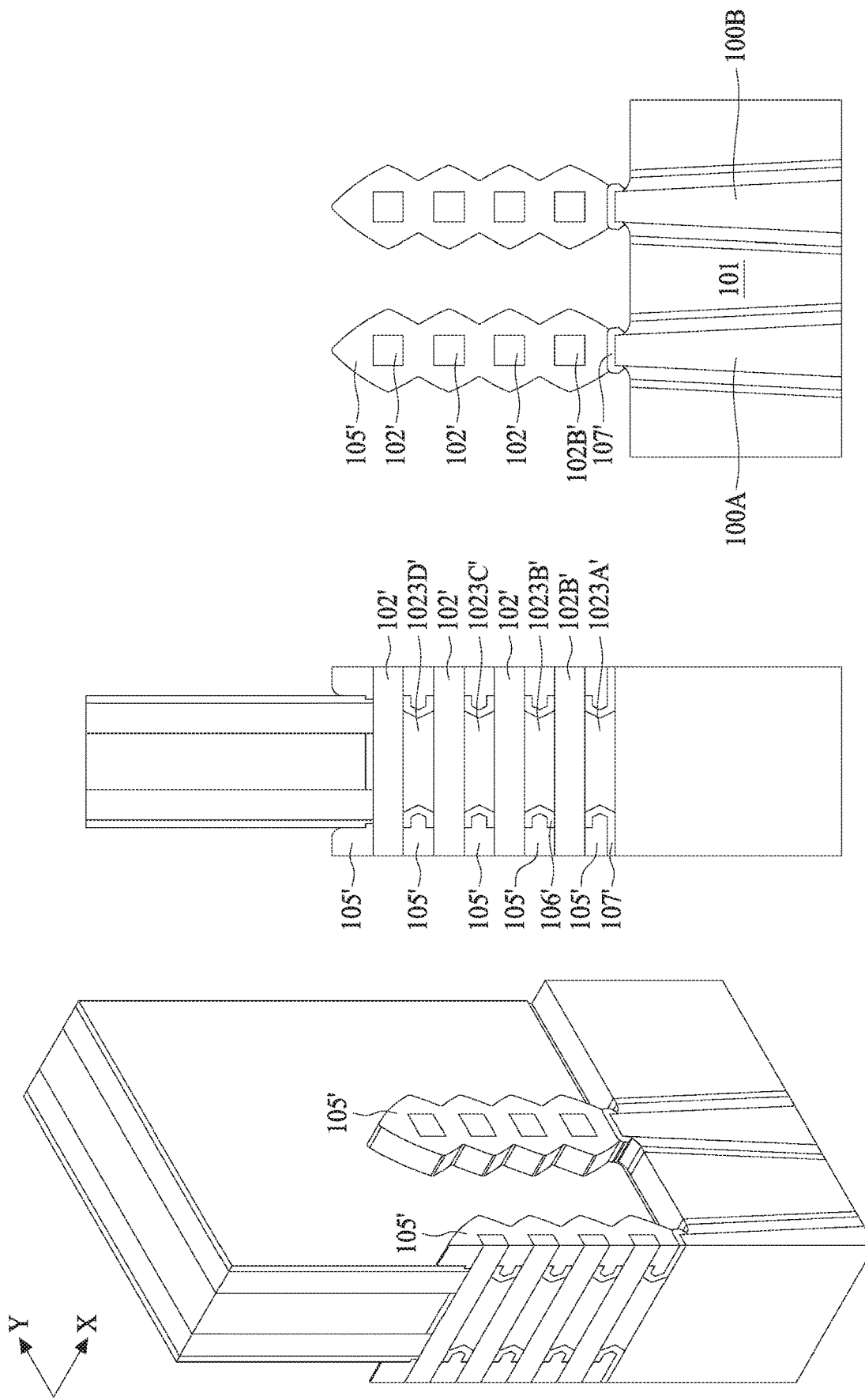

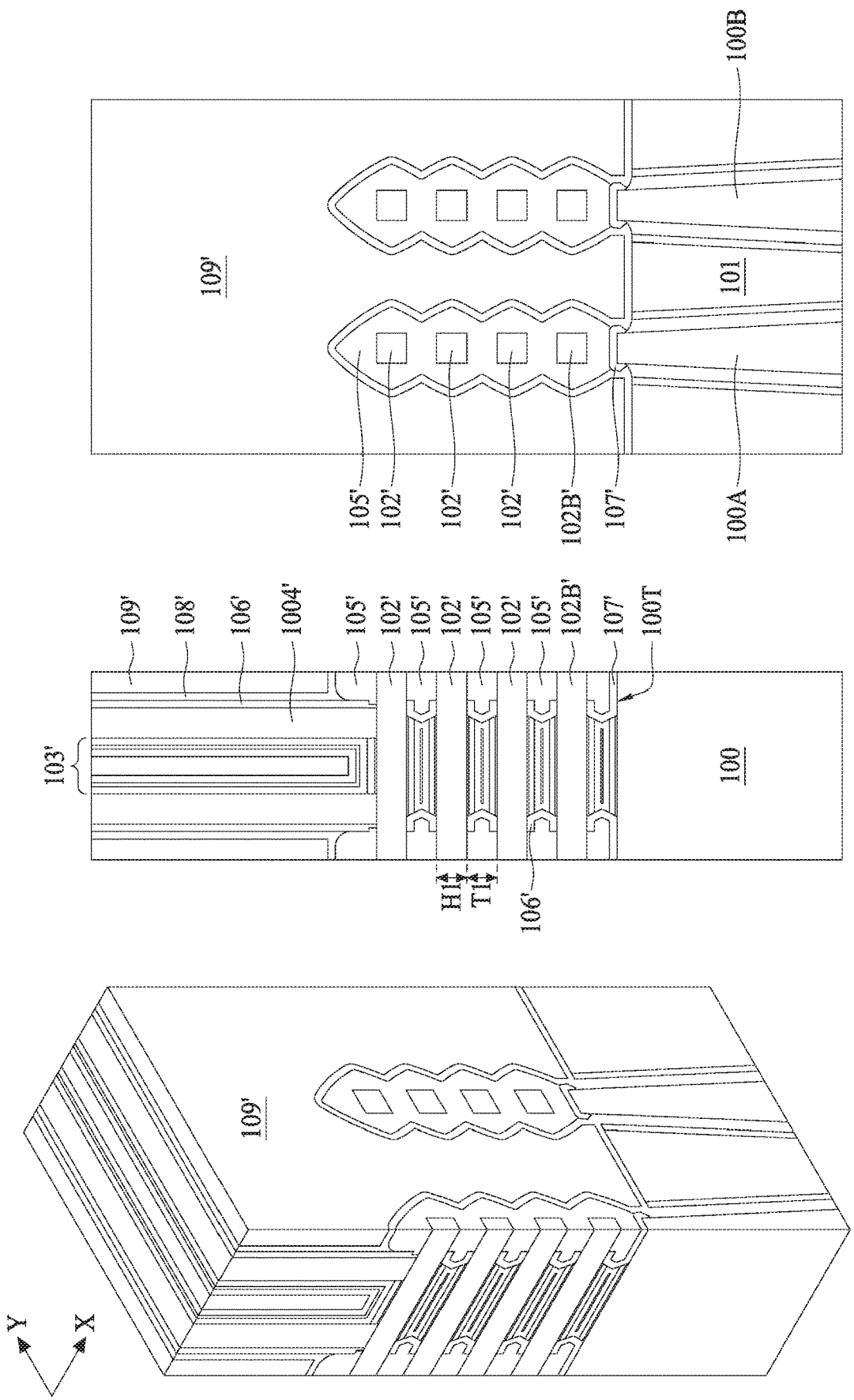

GATE-ALL-AROUND STRUCTURE AND MANUFACTURING METHOD FOR THE SAME

BACKGROUND

A transistor, such as a FinFET transistor, comprises a source region, a drain region, and a channel region between the source region and the drain region. The transistor comprises a gate region that controls the channel region to operate the transistor. The gate region can be formed around one or more surfaces of the channel region, which provides the gate region with increased control over the channel region because the transistor can be controlled by a 3D gate area, as opposed to being controlled merely by a 2D gate area associated with a 2D planar transistor.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3A and FIG. 3B are cross sectional views in an X direction of a PFET and an NFET, respectively, in accordance with some embodiments of the present disclosure.

FIG. 6A to FIG. 6C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 8A to FIG. 8C are a 3D perspective view, a cross sectional view dissecting along an X direction, and a cross sectional view dissecting along a Y direction respectively, of a gate-all-around structure during an intermediate stage of manufacturing operations, in accordance with some embodiments of the present disclosure.

FIG. 9A to FIG. 9C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 10A to FIG. 10C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 11A to FIG. 11C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 12A to FIG. 12C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 14A to FIG. 14C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 17A to FIG. 17C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 19A to FIG. 19C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 21A to FIG. 21C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 22A to FIG. 22C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 23A to FIG. 23C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 24A to FIG. 24C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

FIG. 25A to FIG. 25C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.

DETAILED DESCRIPTION OF THE DISCLOSURE

Figure 1:
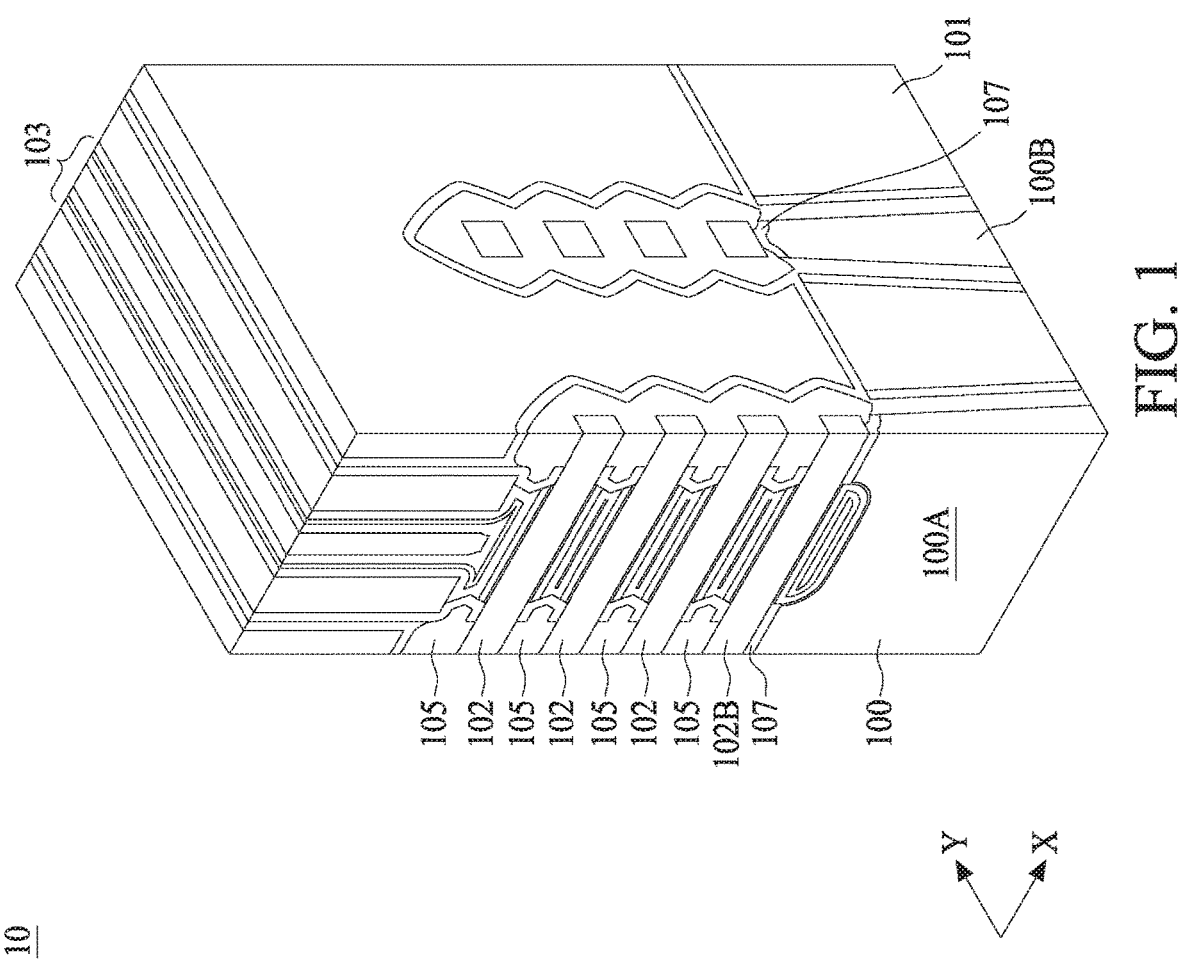
FIG. 1 is a 3D perspective view showing a semiconductor structure, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As the dimensions of MOSFETS (Metal Oxide Semiconductor Field-Effect Transistors) continue to shrink, the reduced length of the channel between source and drain causes unwanted side-effects (short-channel effects) due to the increased electric field intensity therein. Large off-state leakage current is often generated, for example, channel punch-through leakage current and reverse bias p-n junction leakage, and degrading device standby performance. Because ion implantation is a damage-producing technique due to the physical impact of energetic ions, thermal annealing of implanted crystalline silicon is critically important to providing good electrical characteristics of finished devices. Any remaining, or residual, implant damage when made electrically active can enhance the reverse bias junction leakage current if the damage lies near the junction depletion regions. Channel punch-through is a condition in which the depletion layers of the source and the drain connect to each other through the substrate even at equilibrium. At low gate voltages, the punch-through current is injected through the saddle point of the intrinsic potential into the drain region by the electric field from the drain. The effect is premature breakdown of the MOSFETS.

Normally an anti-punch through (APT) implantation is applied to alleviate the channel punch-through leakage current and reverse bias p-n junction leakage, however, as the scale of device shrinkage, the efficiency of APT implantation is challenged from efficiency and manufacturing point of views. Moreover, APT implantation is applied in a region immediately next to channel region, therefore, structural integrity of the channel region is susceptible to be damaged. Gate-all-around MOSFET structure features a 3D gate area with multiple nanowire channels. Instead of having an APT implantation apply close to the channel region, present disclosure provides a structure and manufacturing method of forming an isolation layer at the source/drain and the well/substrate interface, thereby suppressing the punch-through leakage current and reverse bias p-n junction leakage in the gate-all-around MOSFET structure.

The structure provided in the present disclosure eliminates the normally applied APT implantation during manufacturing operations by forming an extra isolation layer at the substrate/well and cladded source/drain interface. The additional isolation layer can be easily integrated into current gate-all-around MOSFET without extra masking operation, which effectively reduces the punch-through leakage current and reverse bias p-n junction leakage in a cost-effective manner.

In the art of gate-all-around MOSFET, several material systems including Group III and Group V materials are currently known and shall be encompassed within the contemplated scope of present disclosure. For example, on a silicon substrate, Si nanowire for NFET and SiGe nanowire for PFET are normally adopted. On a GaAs substrate, GaAs nanowire for NFET and InGaAs nanowire for PFET are normally adopted. On a Ge/GaAs substrate, Ge nanowire for NFET and GaAs nanowire for PFET are normally adopted. For brevity purpose, present disclosure provides illustration and detailed description in Si nanowire and SiGe nanowire material system only. The same inventive concept can be applied on different semiconductor material systems are addressed.

Referring to FIG. 1, FIG. 1 is a 3D perspective view showing a semiconductor structure 10, in accordance with some embodiments of the present disclosure. In some embodiments, the semiconductor structure 10 is a p-type FinFET having SiGe nanowires. The semiconductor structure 10 includes a substrate 100 or a portion of the semiconductor fin. In some embodiments, the substrate 100 includes silicon, and the substrate 100 is formed according to a FinFET arrangement including one or more silicon fins separated by isolation structures 101, such as shallow trench isolation (STI). For example, a first fin 100A and a second fin 100B are formed from on the substrate 100. In an example, an isolation structure 101 has a depth between about 60 nm to about 120 nm. The semiconductor structure 10 further includes a plurality of SiGe nanowires 102 along a longitudinal direction (X-direction) of the first fin 100A, connecting the source/drain 105 at both sides of the SiGe nanowire 102. A metal gate 103 is over the first fin 100A, the second fin 100B, and the SiGe nanowires 102, along a transversal direction (Y-direction) of the first fin 100A. In some embodiments, the metal gate 103 is orthogonally crossing over the first fin 100A, the second fin 100B, and the corresponding SiGe nanowires thereof. In further detail, the metal gate 103 is filled between adjacent SiGe nanowires 102, as shown in semiconductor structure 10 of FIG. 1. On a cross section dissecting along the longitudinal direction of the first fin 100A, or along the X-direction, an isolation layer 107 is shown between the substrate 100 or semiconductor fin and the bottom of the plurality of the SiGe nanowires 102. On a cross section dissecting along the transversal direction of the first fin 100A, or along the Y-direction, at the source/drain 105 location, an isolation layer 107 is shown between the substrate 100 or semiconductor fin and the bottom of the plurality of the SiGe nanowires 102. Although in this embodiment the isolation layer 107 is in contact with a bottom surface of the bottom SiGe nanowire 102B, the proposed isolation layer 107 of the present disclosure, however, does not have to be in contact with the bottom surface of the bottom SiGe nanowire 102, and can be in contact with the source/drain 105 instead. Further details can be found in FIG. 4A of present disclosure.

Figure 2:
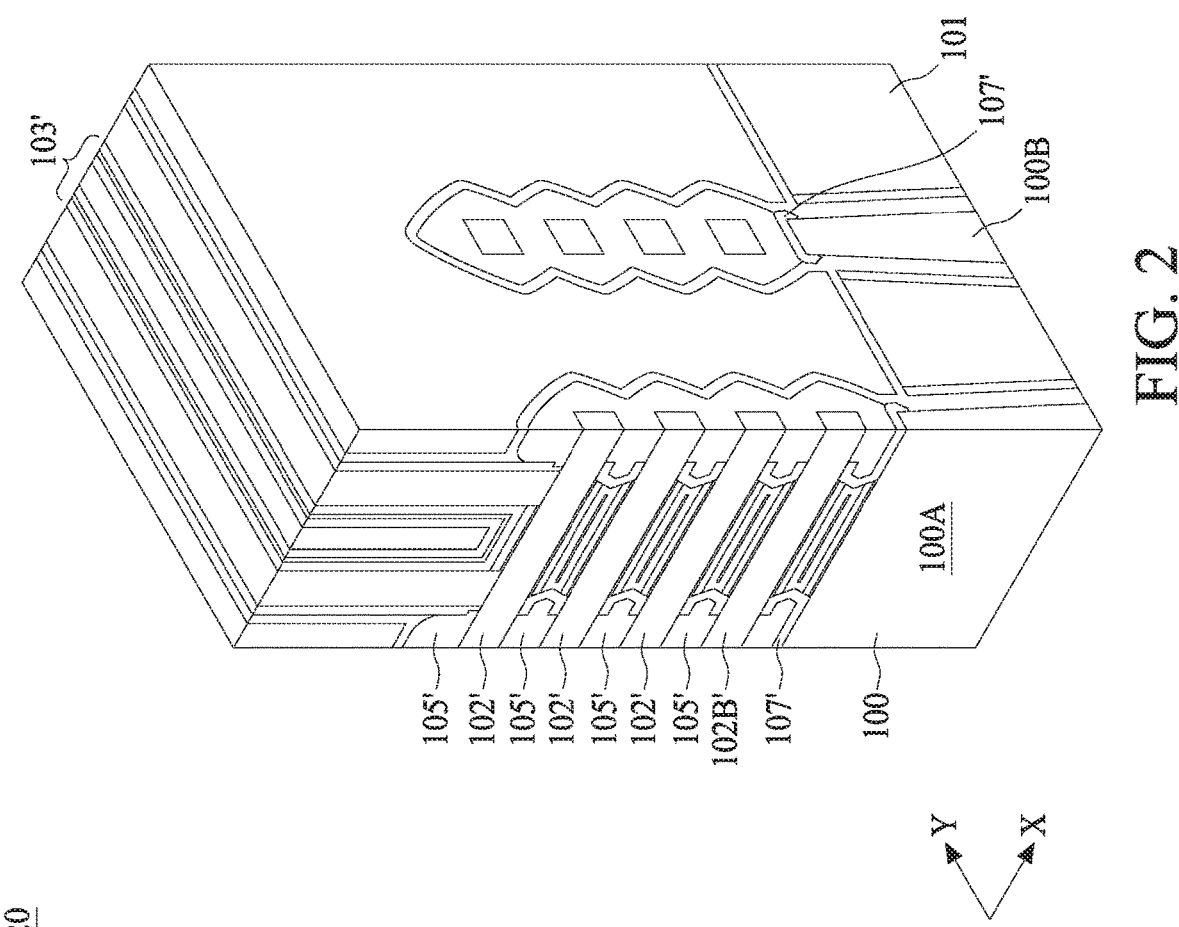
FIG. 2 is a 3D perspective view showing a semiconductor structure, in accordance with some embodiments of the present disclosure.

Referring to FIG. 2, FIG. 2 is a 3D perspective view showing a semiconductor structure 20, in accordance with some embodiments of the present disclosure. In some embodiments, the semiconductor structure 20 is an n-type FinFET having Si nanowires. The semiconductor structure 20 includes a substrate 100 or a portion of the semiconductor fin. In some embodiments, the substrate 100 includes silicon, and the substrate 100 is formed according to a FinFET arrangement including one or more silicon fins separated by isolation structures 101, such as shallow trench isolation (STI). For example, a first fin 100A and a second fin 100B are formed from on the substrate 100. In an example, isolation structure 101 has a depth between about 60 nm to about 120 nm. The semiconductor structure 20 further includes a plurality of Si nanowires 102' along a longitudinal direction (X-direction) of the first fin 100A, connecting the source/drain 105' at both sides of the Si nanowire 102'. A metal gate 103' is over the first fin 100A, the second fin 100B, and the Si nanowires 102', along a transversal direction (Y-direction) of the first fin 100A. In some embodiments, the metal gate 103' is orthogonally crossing over the first fin 100A, the second fin 100B, and the corresponding Si nanowires thereof. In further detail, the metal gate 103' is filled between adjacent Si nanowires 102', as shown in semiconductor structure 20 of FIG. 2. On a cross section dissecting along the longitudinal direction of the first fin 100A, or along the X-direction, an isolation layer 107' is shown between the substrate 100 or semiconductor fin and the bottom of the plurality of the Si nanowires 102. On a cross section dissecting along the transversal direction of the first fin 100A, or along the Y-direction, at the source/drain 105' location, an isolation layer 107' is shown between the substrate 100 or semiconductor fin and the bottom of the plurality of the Si nanowires 102'. In present semiconductor structure 20, the proposed isolation layer 107' is not in contact with the bottom surface of the bottom Si nanowire 102B', and is in contact with the source/drain 105'. Further details can be found in FIG. 4B of present disclosure.

Referring to FIG. 3A, FIG. 3A is a cross sectional view dissecting along an X direction on a semiconductor fin of a PFET. FIG. 3A shows a gate-all-around structure 10X as a portion of a first transistor. The gate-all-around structure 10X includes a semiconductor substrate 100 and a plurality of SiGe nanowires 102 over the semiconductor substrate 100. Among the plurality of SiGe nanowires 102, the bottom of which is designated as a bottom SiGe nanowire 102B that is the closest to a top surface 100T of the semiconductor substrate 100. The plurality of SiGe nanowires 102 access the source/drain 105 at both sides. A gate 103 is having a portion over all the SiGe nanowires 102 and another portion filled between vertically adjacent SiGe nanowires 102. An inner spacer 106 composed of isolation material separates the source/drain 105 and the portion of gate 103 filled between SiGe nanowires 102. As shown in FIG. 3A, the inner spacer 106 is having a C-shape by conforming to a sidewall of the portion of gate 103 filled between SiGe nanowires 102 and to a top and bottom surface of the adjacent SiGe nanowires 102. Also shown in FIG. 3A, an isolation layer 107 is formed between the source/drain 105 and the top surface 100T of the substrate. In some embodiments, the isolation layer 107 is formed between the bottom SiGe nanowire 102B and the top surface 100T of the substrate. In some embodiments, the isolation layer 107 is in physical contact with the bottom SiGe nanowire 102B and the top surface 100T of the substrate. In other embodiments, the isolation layer 107 is in physical contact with the top surface 100T of the substrate but not with the bottom SiGe nanowire 102B. In some embodiments, the isolation layer 107 and the inner spacer 106 are composed of substantially identical materials that provide isolation function, such as nitride materials.

In some embodiments, a thickness T1 of the SiGe nanowire 102 is in a range of from about 3 nm to about 13 nm. In some embodiments, a thickness H1 of the portion of the gate 103 filled between vertically adjacent SiGe nanowires 102 is comparable to the thickness T1 of the SiGe nanowire 102, for example, in a range of from about 3 nm to about 13 nm.

Referring to FIG. 3B, FIG. 3B is a cross sectional view dissecting along an X direction on a semiconductor fin of an NFET. FIG. 3B shows a gate-all-around structure 20X as a portion of a second transistor formed on a same substrate with the first transistor. The gate-all-around structure 20X includes a semiconductor substrate 100 and a plurality of Si nanowires 102' over the semiconductor substrate 100. Among the plurality of Si nanowires 102', the bottom of which is designated as a bottom Si nanowire 102B' that is the closest to a top surface 100T of the semiconductor substrate 100. The plurality of Si nanowires 102' access the source/drain 105' at both sides. A gate 103' is having a portion over all the Si nanowires 102' and another portion filled between vertically adjacent Si nanowires 102'. An inner spacer 106' composed of isolation material separates the source/drain 105' and the portion of gate 103' filled between Si nanowires 102'. As shown in FIG. 3B, the inner spacer 106' is having a C-shape by conforming to a sidewall of the portion of gate 103' filled between Si nanowires 102' and to a top and bottom surface of the adjacent Si nanowires 102'. Also shown in FIG. 3B, an isolation layer 107' is formed between the source/drain 105' and the top surface 100T of the substrate. In some embodiments, the isolation layer 107' is in physical contact with the top surface 100T of the substrate 100 and the source/drain 105'. In other embodiments, the isolation layer 107 is in physical contact with the inner spacer 106' surrounding the bottom Si nanowire 102B', for example, the isolation layer 107' is an extension of the bottom leg of the C-shape of the inner spacer 106'. In some embodiments, the isolation layer 107' and the inner spacer 106' are composed of substantially identical materials that provide isolation function, such as nitride materials.

In some embodiments, a thickness T1' of the Si nanowire 102' is in a range of from about 3 nm to about 13 nm. In some embodiments, a thickness H1' of the portion of the gate 103' filled between vertically adjacent Si nanowires 102' is comparable to the thickness T1' of the Si nanowire 102', for example, in a range of from about 3 nm to about 13 nm.

Figure 4A:
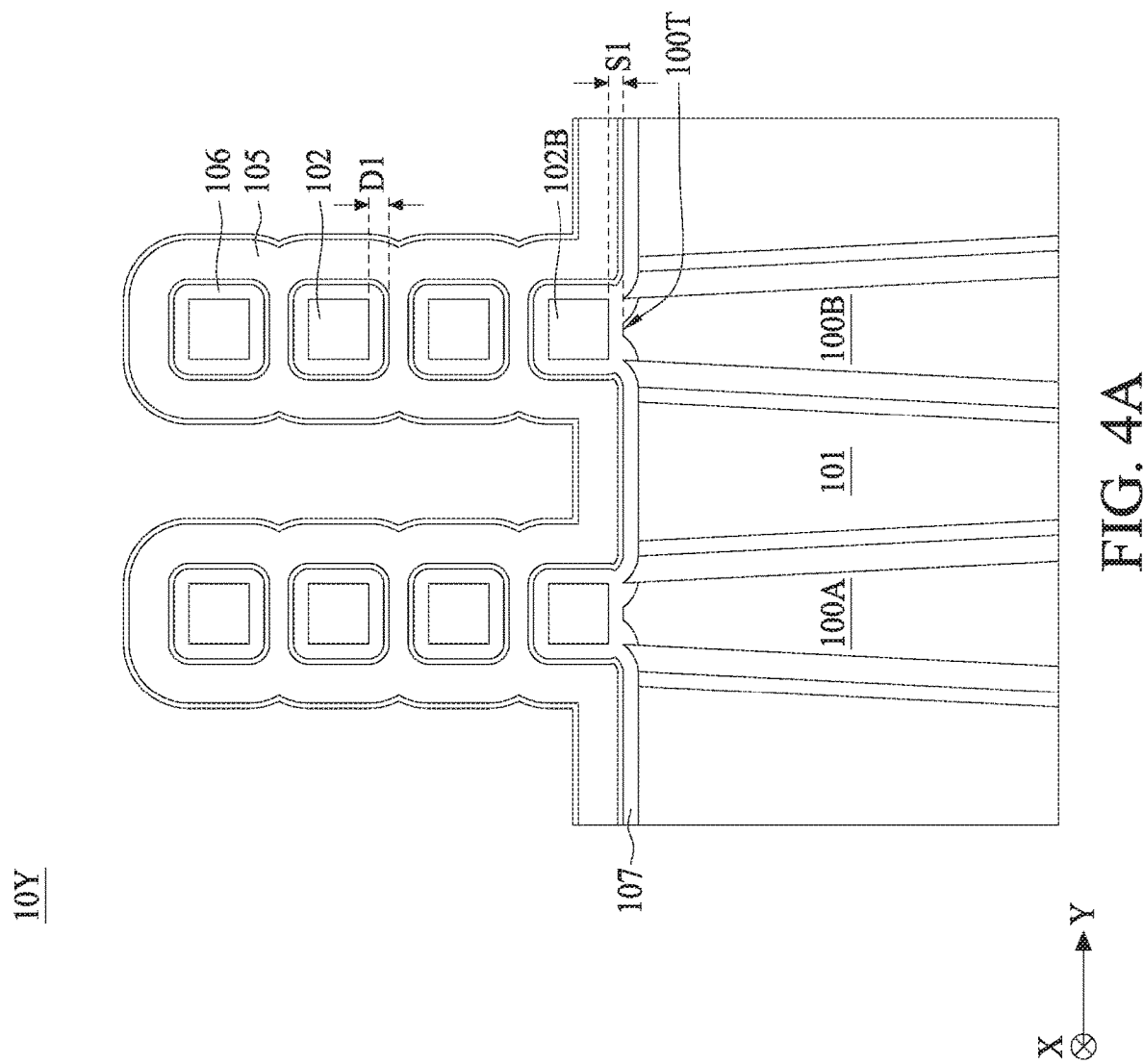
FIG. 4A is a cross sectional views in a Y direction a PFET, in accordance with some embodiments of the present disclosure.

Referring to FIG. 4A, FIG. 4A is a cross sectional view dissecting along a Y direction of a PFET along dotted lines AA' of FIG. 3A. Dotted lines AA' is illustrated aligning to a C-shape terminal of the inner spacer 106. FIG. 3A illustrates a semiconductor structure 10Y having a plurality of SiGe nanowires 102 vertically stacked over the semiconductor substrate 100 or semiconductor fin 100A or 100B. A periphery of each of the SiGe nanowires 102 is surrounded by an inner spacer 106. The inner spacer 106 surrounding a bottom surface of the bottom SiGe nanowire 102B is in contact with the isolation layer 107 over a top surface 100T of the semiconductor fin 100B. In some embodiments, a space S between the top surface 100T of the semiconductor fin 100B and a bottom surface of the bottom SiGe nanowire 102B is greater than a thickens D1 of the inner spacer 106 surrounding the SiGe nanowires 102. In some embodiments, the thickens D1 is substantially the same as the thickness of the isolation layer 107. The space Si is determined to be greater than the thickens D1 in order to allow the inner spacer 106 and the isolation layer 107 to completely deposited or formed in the space S1 with target thickness D1. Although not illustrated in FIG. 4A, in some embodiments, if the space Si is greater than 2 times of the thickens D1, source/drain 105 may be formed between the top surface 100T of the semiconductor fin 100B and the bottom surface of the bottom SiGe nanowire 102B.

Figure 4B:
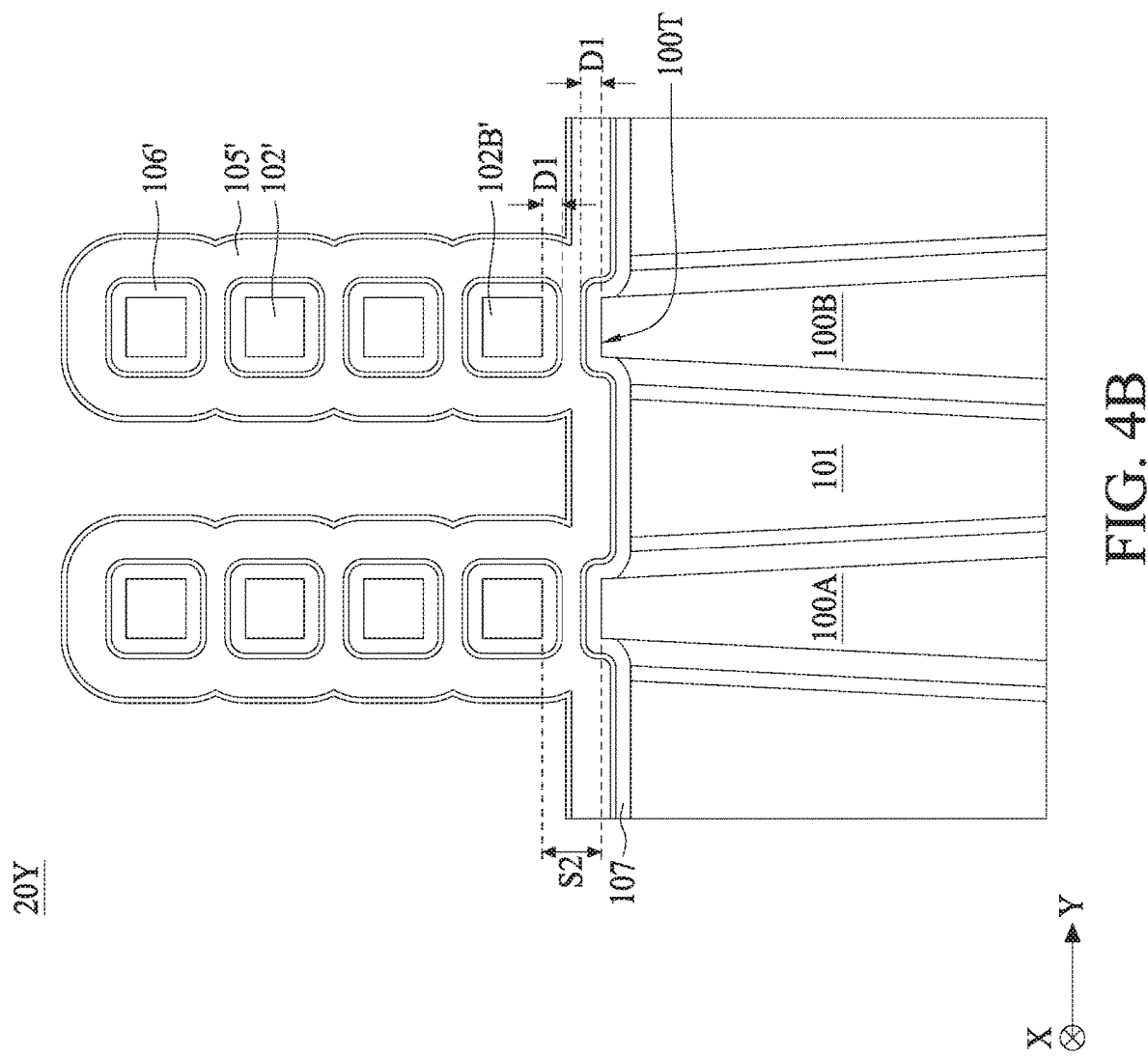
FIG. 4B is a cross sectional views in a Y direction an NFET, in accordance with some embodiments of the present disclosure.

Referring to FIG. 4B, FIG. 4B is a cross sectional view dissecting along a Y direction of an NFET along dotted lines BB' of FIG. 3B. Dotted liens BB' is illustrated aligning to a C-shape terminal of the inner spacer 106'. FIG. 3B illustrates a semiconductor structure 20Y having a plurality of Si nanowires 102' vertically stacked over the semiconductor substrate 100 or semiconductor fin 100A or 100B. A periphery of each of the Si nanowires 102' is surrounded by an inner spacer 106'. The inner spacer 106' surrounding a bottom surface of the bottom Si nanowire 102B' is not in contact with the isolation layer 107 over a top surface 100T of the semiconductor fin 100B. In some embodiments, a space S2 between the top surface 100T of the semiconductor fin 100B and a bottom surface of the bottom Si nanowire 102B' is greater than two times of the thickness D2 of the inner spacer 106' surrounding the Si nanowires 102'. In some embodiments, the thickens D2 is substantially the same as the thickness of the isolation layer 107. The space S2 is determined to be at least greater than two times of the thickens D2 in order to allow an oxide layer subsequently deposited but removed in the final product to enter the space between the inner spacer-coated bottom Si nanowire 102B' and the isolation layer-coated top surface 100T of the semiconductor fin 100B. The successful entrance of the oxide layer is essential to the desired final structure since said oxide layer functions as a hard mask preventing the isolation layer 107 over the top surface 100T to be removed during a subsequent wet etch operation. Details of the manufacturing operation are further discussed in FIG. 20A to FIG. 23C of present disclosure.

Figure 5B:
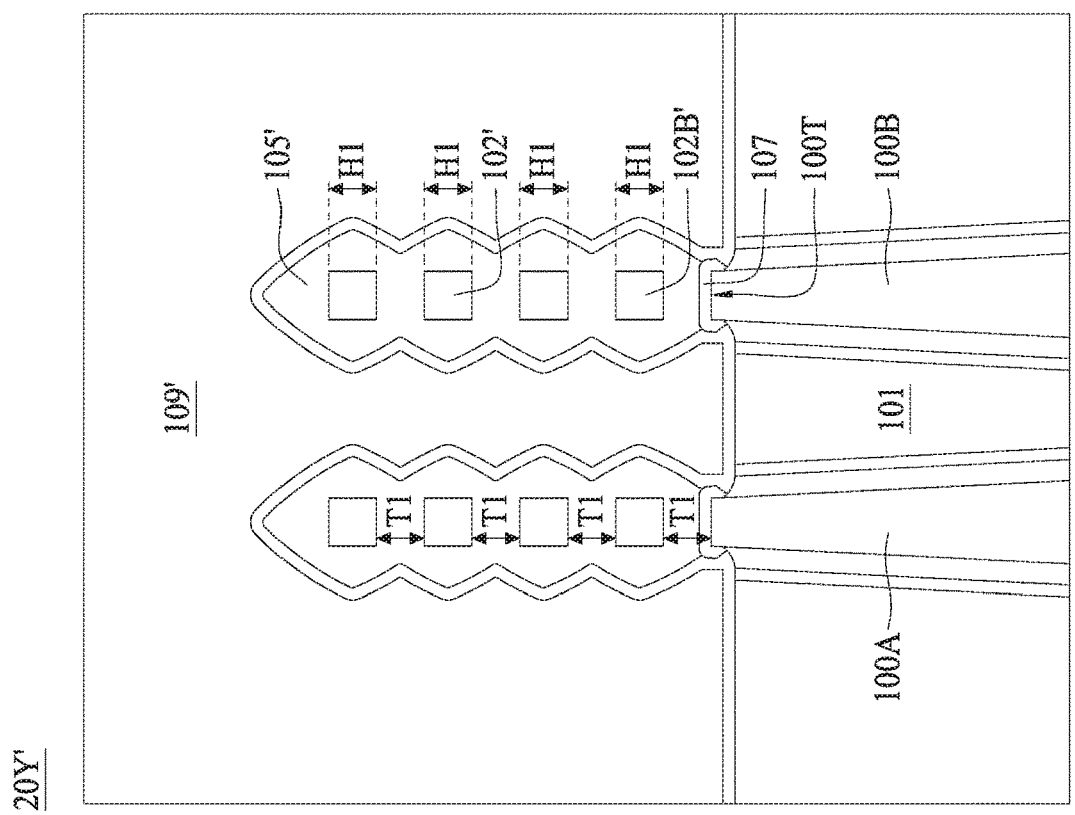
FIG. 5A and FIG. 5B are cross sectional views in a Y direction of a PFET and an NFET, respectively, in accordance with some embodiments of the present disclosure.
Figure 5A:
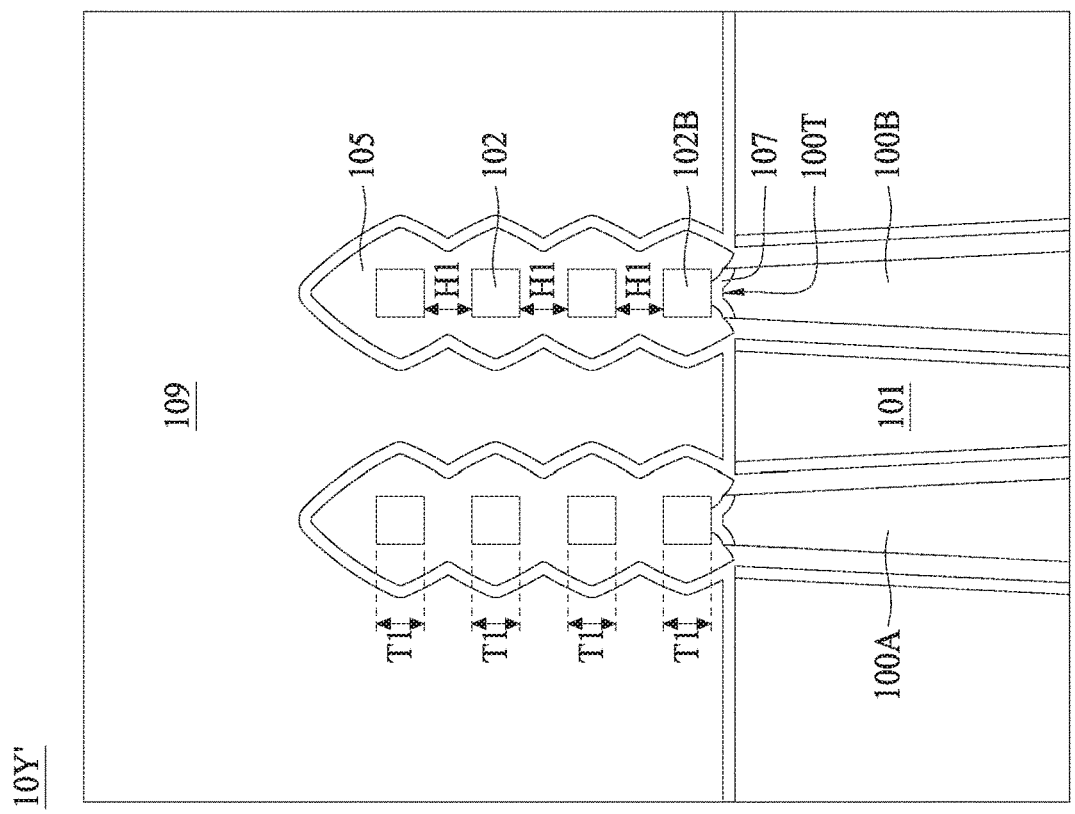

Referring to FIG. 5A, FIG. 5A is a cross sectional view dissecting along a Y direction of a PFET along dotted lines CC' of FIG. 3A. Dotted lines CC' is illustrated aligning to a portion of source/drain 105 overlapped by the ILD 109. FIG. 5A illustrates a semiconductor structure 10Y' having a plurality of SiGe nanowires 102 vertically stacked over the semiconductor substrate 100 or semiconductor fin 100A or 100B. Because the dissecting line does not pass through the inner spacer 106, a periphery of each of the SiGe nanowires 102 is directly surrounded by source/drain 105. The source/drain 105 shown in FIG. 5A is having faceted boundaries as a result of limiting epitaxial growth rate in certain particular crystal directions. In some embodiments where the space S between the top surface 100T of the semiconductor fin 100B and a bottom surface of the bottom SiGe nanowire 102B is equal to a thickens D1 of the isolation layer 107, the isolation layer 107 may be in contact with the bottom of the bottom SiGe nanowire 102B. In other embodiments where the space S1 between the top surface 100T of the semiconductor fin 100B and a bottom surface of the bottom SiGe nanowire 102B is greater than a thickens D1 of the isolation layer 107, the isolation layer 107 may not be in contact with the bottom of the bottom SiGe nanowire 102B. Instead, the source/drain 105 is spacing between the isolation layer 107 and the bottom of the bottom SiGe nanowire 102B.

Referring to FIG. 5B, FIG. 5B is a cross sectional view dissecting along a Y direction of an NFET along dotted lines DD' of FIG. 3B. Dotted lines DD' is illustrated aligning to a portion of source/drain 105 overlapped by the ILD 109. FIG. 5B illustrates a semiconductor structure 20Y' having a plurality of Si nanowires 102' vertically stacked over the semiconductor substrate 100 or semiconductor fin 100A or 100B. Because the dissecting line does not pass through the inner spacer 106, a periphery of each of the Si nanowires 102' is directly surrounded by source/drain 105'. The source/drain 105' shown in FIG. 5B is having faceted boundaries as a result of limiting epitaxial growth rate in certain particular crystal directions. In some embodiments where the space S1 between the top surface 100T of the semiconductor fin 100B and a bottom surface of the bottom Si nanowire 102B' is e greater than two times of the thickens D1 of the isolation layer 107', the isolation layer 107' is not in contact with the bottom of the bottom Si nanowire 102B', instead, the isolation layer 107' is in contact with the source/drain 105' under the bottom Si nanowire 102B'.

FIG. 6A to FIG. 17C are a p-type gate-all-around structure or a PFET during intermediate stages of manufacturing operations, in accordance with some embodiments of the present disclosure. Each intermediate stage is represented by three perspectives: a 3D perspective view, a cross sectional view dissecting along an X direction on a semiconductor fin of the PFET, and a cross sectional view dissecting in a Y direction of the PFET along dotted lines CC' of FIG. 6A.

In FIG. 6A to FIG. 6C, a silicon and silicon germanium stack 1023 is formed over the substrate 100. For example, a first silicon and silicon germanium stack 1023 is formed over the substrate 100. The first silicon and silicon germanium stack 1023 includes one or more silicon layers and one or more silicon germanium layers. For example, the first silicon and silicon germanium stack 1023 includes a first silicon layer 1023A, a first silicon germanium layer 1023A', a second silicon layer 1023B, a second silicon germanium layer 1023B', a third silicon layer 1023C, a third silicon germanium layer 1023C', a fourth silicon layer 1023D, and a fourth silicon germanium layer 1023D'. It is appreciated that any number of silicon layers or silicon germanium layers can be formed. In an example, a silicon germanium layer comprises between about 20% to about 50% germanium. The silicon and silicon germanium stack 1023 is then patterned to form semiconductor fins 100A and 100B, separated by an STI 101, a first liner layer 1001, and a second liner layer 1002. An input/output (I/O) oxide layer 1003 is conformably formed over the portion of the fins 100A, 100B protruding from the STI 101 as well as over the top surface of the STI 101. A dummy gate 1030 is orthogonally formed, by a subsequent patterning operation, across the first and second fins 100A, 100B after the formation of the I/O oxide layer 1003. The dummy gate 1030 is a sacrificial gate, such as a polygate, formed by a patterning technique. As shown in FIG. 6B, the dummy gate 1030 is not directly contacting the patterned first silicon and silicon germanium stack 1023 but is in direct contact with the I/O oxide layer 1003. Since FIG. 6C is dissecting along the dotted lines CC' of FIG. 6A, no dummy gate 1030 is shown in FIG. 6C.

Figure 7C:
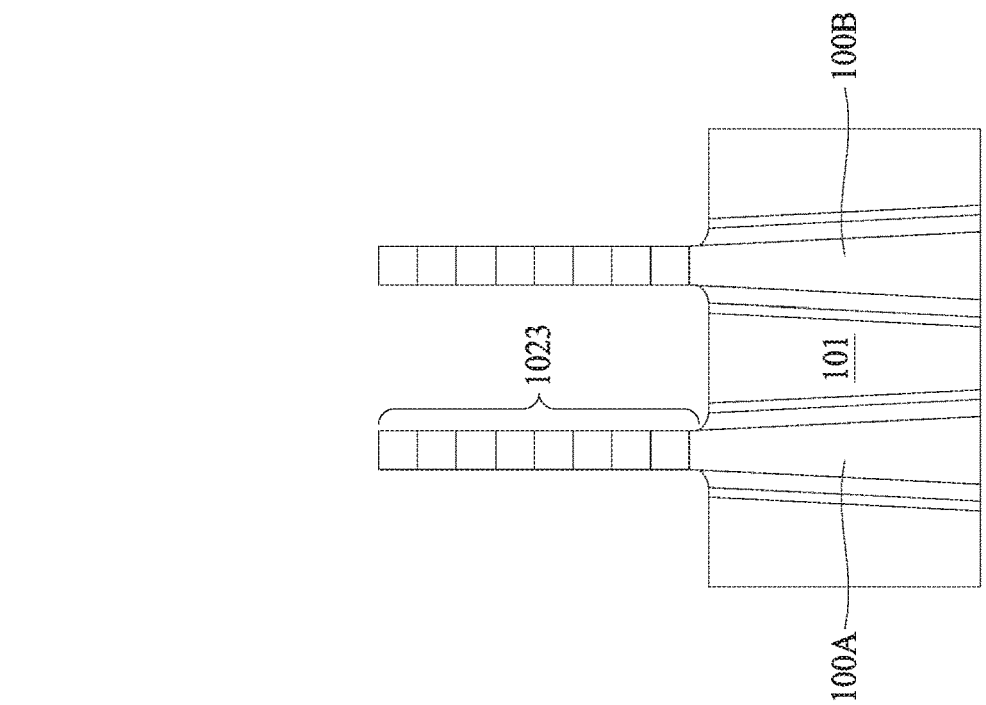
FIG. 7A to FIG. 7C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.
Figure 7B:
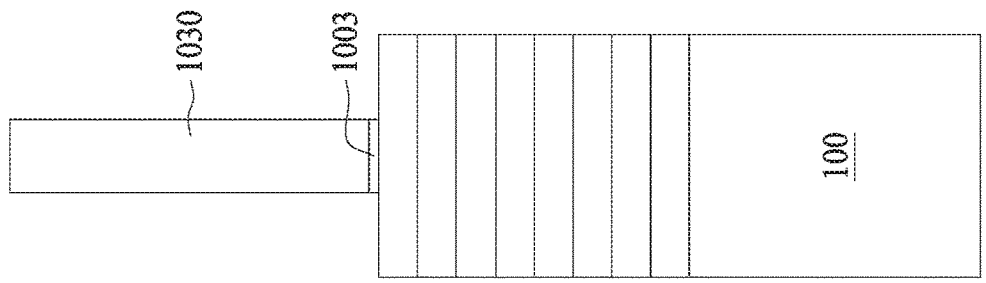
Figure 7A:
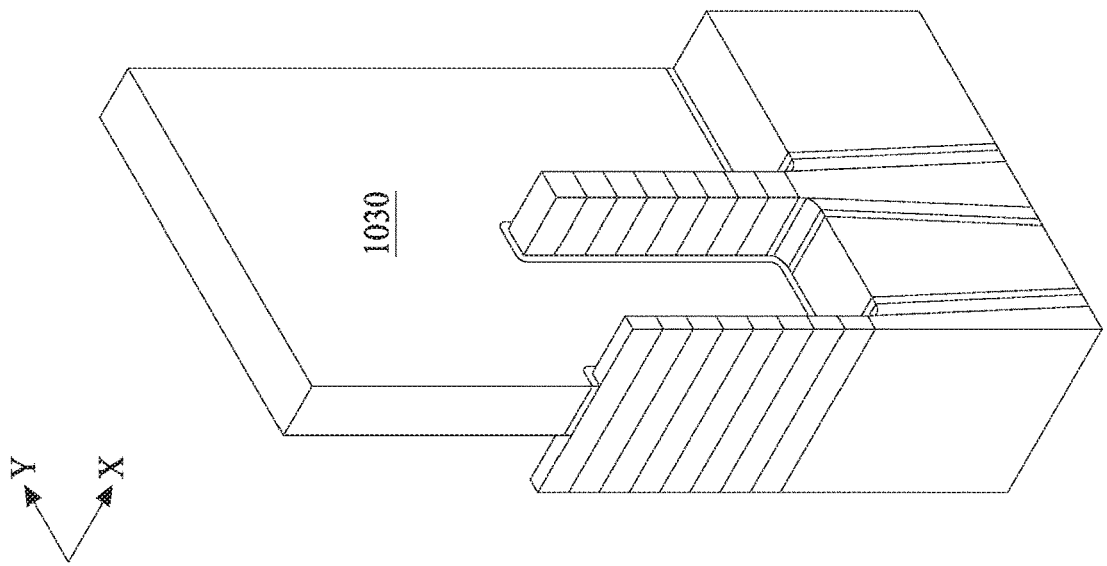

In FIG. 7A to FIG. 7C, the I/O oxide layer 1003 not masked by the dummy gate 1030 is removed. As shown in FIG. 7B, only the portion of the I/O oxide layer 1003 under the dummy gate 103 is remained after current oxide etching operation. In FIG. 8A to FIG. 8C, a seal spacer 1004 is conformably deposited over the fins 100A and 100B not masked by the dummy gate 1030. The seal spacer 1004 also deposited to surround the sidewall of the dummy gate 1030. In FIG. 9A to FIG. 9C, a masked etch is performed in order to remove the seal spacer 1004 from a portion of the patterned first silicon and silicon germanium stack 1023 that is not covered by the photoresist 1005. As shown in FIG. 9B, a portion of the top surface of the first silicon and silicon germanium stack 1023 is exposed from the seal spacer 1004. This masked etch also removes the seal spacer 1004 over the STI surface. In FIG. 9C, a top surface of the STI 101 and a sidewall of the first silicon and silicon germanium stack 1023 are exposed from the seal spacer 1004 previously deposited thereon.

In FIG. 10A to FIG. 10C, a selective etch is performed to laterally remove the patterned silicon stacks 1023A, 1023B, 1023C, and 1023D while maintaining little to no removal of the patterned silicon germanium stacks 1023A', 1023B', 1023C', and 1023D' or the SiGe nanowire 102 in the final structure. In some embodiments, the selective etch stops upon the showing of faceted crystal surfaces (111) of the patterned silicon stacks. As shown in FIG. 10C, a plurality of vertically stacked SiGe nanowires 102 are released from the patterned silicon stacks 1023A, 1023B, 1023C, and 1023D and are free standing with respect to etch other. A bottom surface of the bottom SiGe nanowire 102B shows a separation S1 with the top surface 100T of the fin 100B.

In FIG. 11A to FIG. 11C, a dielectric layer 1006 is conformably formed over the sidewall of the seal spacer 1004, the sidewall of the faceted crystal surfaces (111) of the patterned silicon stacks 1023A, 1023B, 1023C, and 1023D, and surrounding the plurality of SiGe nanowires 102. In some embodiments, the dielectric layer 1006 includes isolation materials, for example, low-k dielectric or silicon nitrides. The portion of the dielectric layer 1006 formed at the sidewall of the faceted crystal surfaces (111) of the patterned silicon stacks 1023A, 1023B, 1023C, 1023D is called inner spacer 106 in the present disclosure. The portion of the dielectric layer 1006 formed at the top surface 1001' of the fins 100A, 100B or substrate 100 is called isolation layer 107 in the present disclosure. As shown in FIG. 11C, a thickness D1 of the dielectric layer 1006 initially deposited can be determined according to a spacing or thickness H1 between adjacent free standing SiGe nanowires 102. In some embodiments, the thickens D1 of the dielectric layer 1006 is selected to be half of the spacing or thickness H1 in order to accommodate itself into the spacing or thickens H1. In some embodiments, the separation Si shall be designed to be greater than the thickens D1 of the dielectric layer 1006 so as to allow the dielectric layer 1006 to enter the separation Si and evenly cover the top surface 100T of the semiconductor fins 100A, 100B.

In FIG. 12A to FIG. 12C, an oxide layer 1007 is conformably formed to surround the sidewall of the dummy gate 1030, the seal spacer 1004, and the dielectric layer 1006. The oxide layer 1007 also fills the spacing or thickness H1 between adjacent free standing SiGe nanowires 102. As shown in FIG. 12C, the oxide layer 1007 surrounds the plurality of the free standing SiGe nanowires 102 as well as the dielectric layer 1006 cover thereon in the previous operation. Although not illustrated in FIG. 12C, in the case where separation S is greater than 2 times of the thickens D1 of the dielectric layer 1006, the oxide layer 1007 could enter the separation S between the top surface 100T of the semiconductor fins 100A, 100B and the bottom of the bottom SiGe nanowire 102B because the separation S1 is spacious enough to accommodate 2 layers of dielectric layer 1006, one at the bottom of the bottom SiGe nanowire 102B, the other at the top surface 100T of the semiconductor fin 100A, 100B, as well as an extra oxide layer 1007.

Figure 13C:
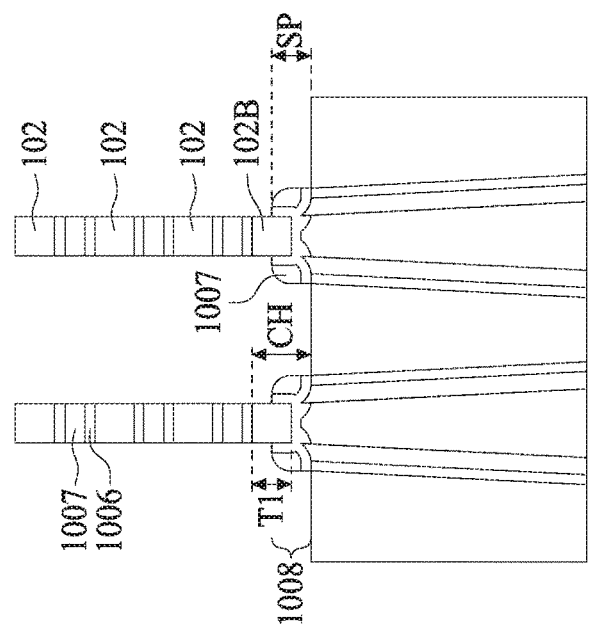
FIG. 13A to FIG. 13C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.
Figure 13B:
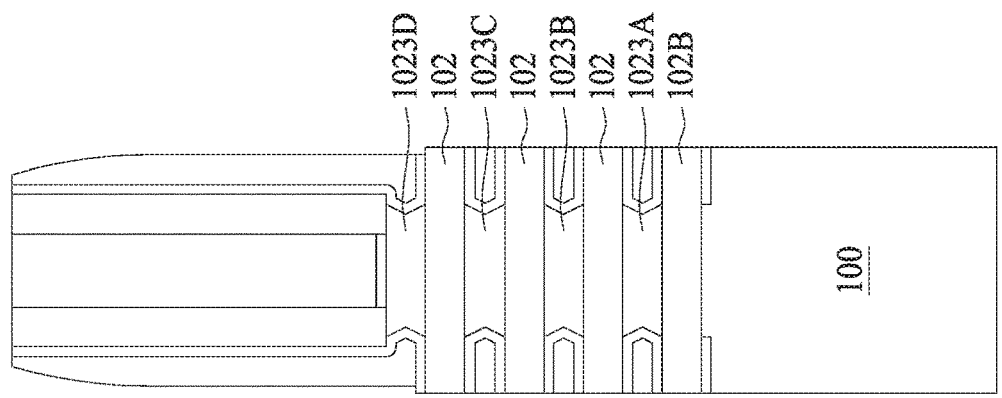
Figure 13A:
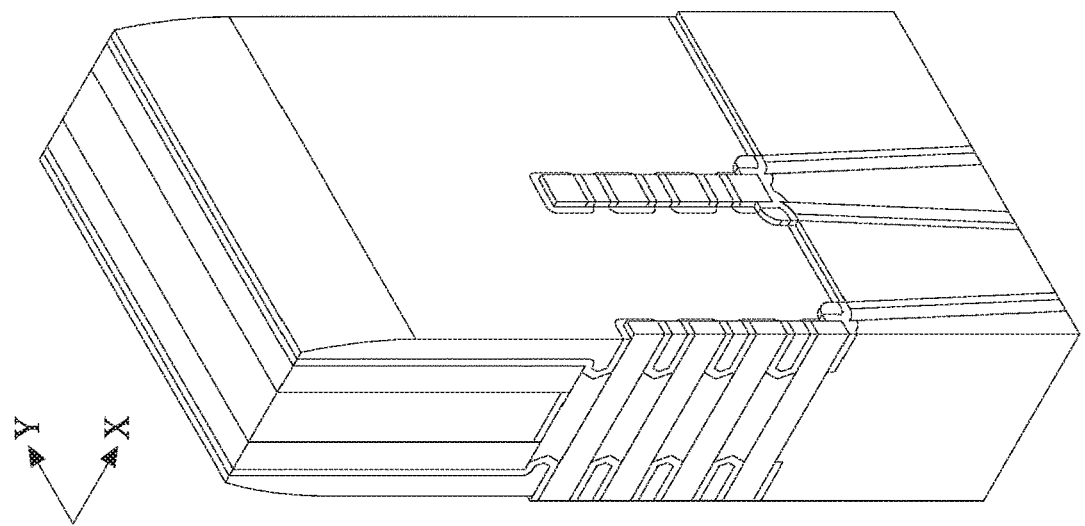

In FIG. 13A to FIG. 13C, an anisotropic etch is performed on the dielectric layer 1006 and the oxide layer 1007. As shown in FIG. 13B, the sidewall of the oxide layer 1007 is partially rounded after the anisotropic etch. In FIG. 13C, the anisotropic etch is controlled to remove the oxide layer 1007 and the dielectric layer 1006 surrounding at the sidewalls of the SiGe nanowire 102 to an extent that a bottom spacer 1008 forms as a residual of the isotropic etch operation. The bottom spacer 1008 is composed of remaining dielectric layer 1006 between the remaining oxide layer 1007 and a sidewall of the bottom SiGe nanowire 102B. A height SP of the bottom spacer 1008 is measured from an STI 101 top to the spacer 1008 top. In some embodiments, the bottom spacer 1008 is controlled to at least partially surround the bottom SiGe nanowire 102B. Alternatively stated, if the distance CH is measured from the STI 101 top to the bottom SiGe nanowire 102B top, a difference between the distance CH and the height SP shall be a positive number smaller than a thickness T1 of the bottom SiGe nanowire 102B.

In FIG. 14A to FIG. 14C, an isotropic etch is performed to remove a portion of the dielectric layer 1006 not in contact with the top surface 100T of the semiconductor fins 100A, 100B. As shown in FIG. 14B, the dielectric layer 1006 surrounding the SiGe nanowires 102, excluding the bottom SiGe nanowire 102B, is removed by the isotropic etch, for example, a wet etch operation which removes low-k or nitride materials. Only the dielectric layer 1006 between the top surface 100T and the bottom of the bottom SiGe nanowire 102B is not removed by the isotropic etch. The aforesaid portion of the dielectric layer 1006 turns in to the isolation layer 107 in the final structure. As previously stated, the bottom spacer 1008 is controlled to at least partially surround the bottom SiGe nanowire 102B. The oxide layer 1007 of the bottom spacer 1008 functions as a hardmask to the isolation layer 107 so as to prevent the complete removal of the remaining dielectric layer 1006 during the isotropic etch operation.

Figure 15C:
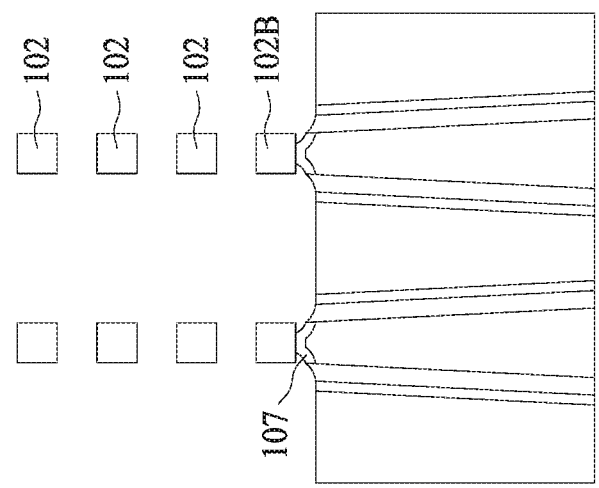
FIG. 15A to FIG. 15C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.
Figure 15B:
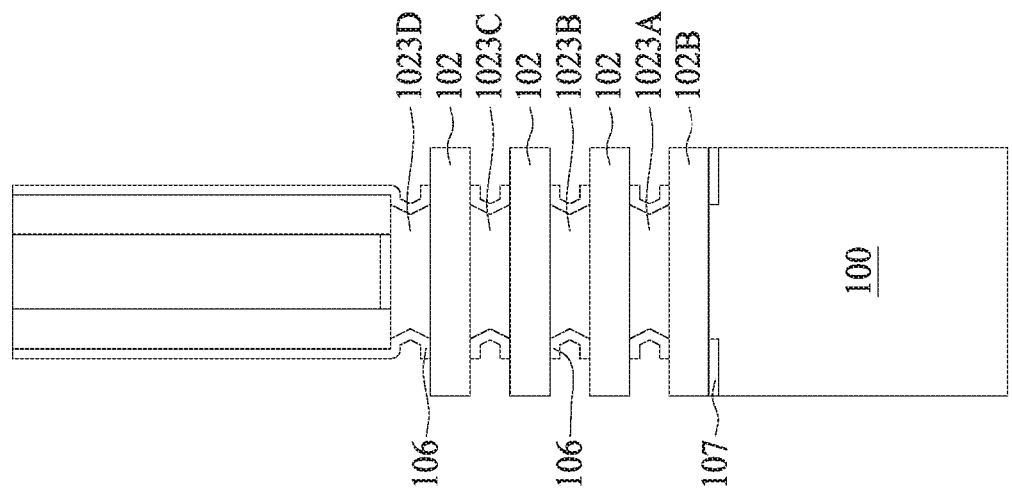
Figure 15A:
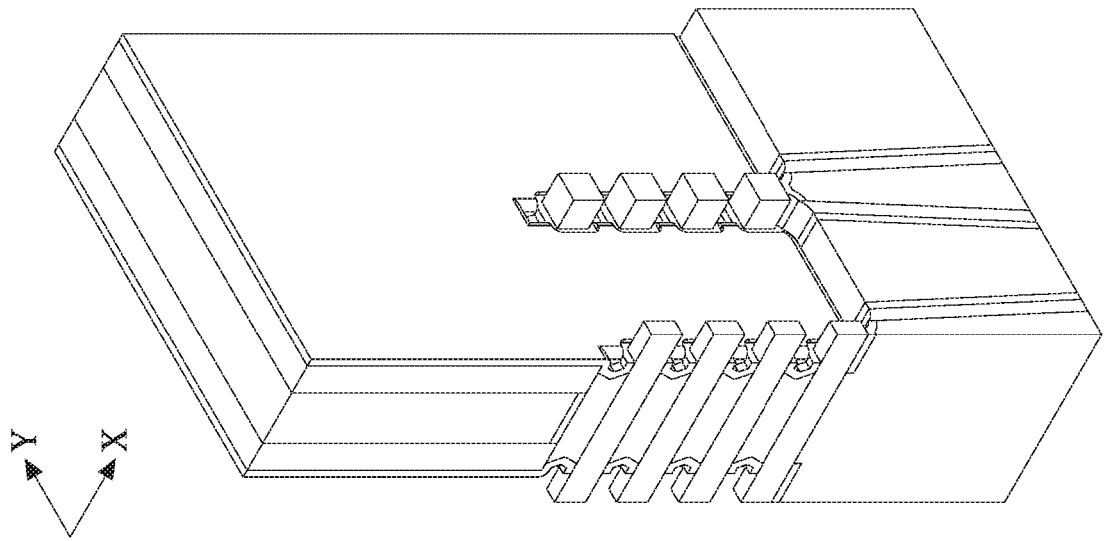
Figure 16C:
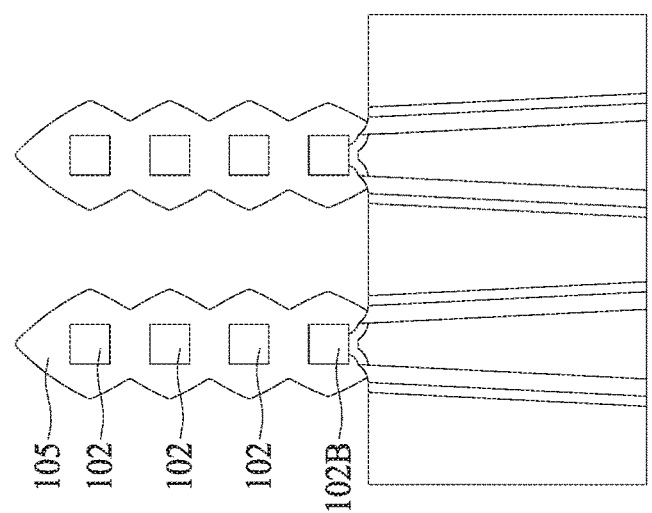
FIG. 16A to FIG. 16C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.
Figure 16B:
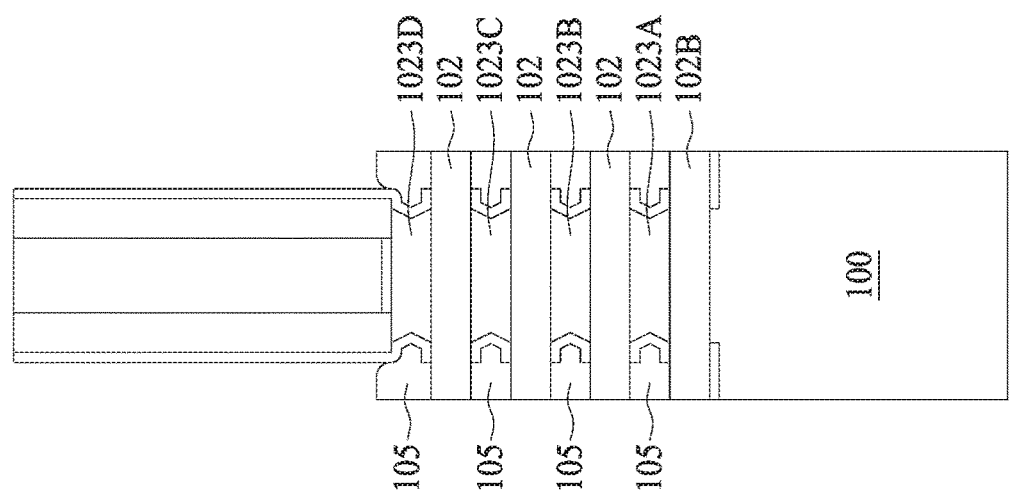
Figure 16A:
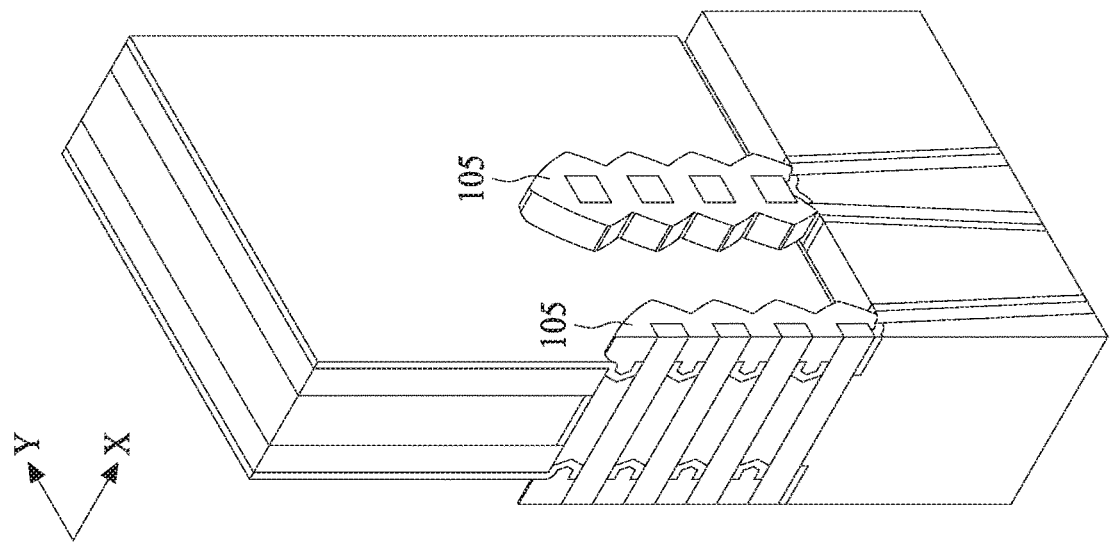

In FIG. 15A to FIG. 15C, the remaining oxide layer 1007 at the bottom spacer 1008 and at the sidewall of the dummy gate 1030 are removed by an oxide wet etch operation. In FIG. 16A to FIG. 16C, a source/drain 105 is formed within a first source region and a first drain region, such as through an epitaxial growth technique, to create a first source and a first drain for the silicon germanium nanowire PFET. In some embodiments, the source/drain 105 is composed of SiGeB. As shown in FIG. 16C, the source/drain 105 possesses faceted boundaries as a result of limiting epitaxial growth rate in certain particular crystal directions. In FIG. 17A to FIG. 17C, a replacement gate 103 is formed to complete the PFET. After removal of the dummy gate 1030 and the patterned silicon stacks 1023A, 1023B, 1023C, and 1023D, an interfacial layer material, a high-k dielectric layer, a titanium nitride capping layer, a work function metal layer, and tungsten gate metal can be formed around as well as over the plurality of SiGe nanowire 102. An etch stop layer 108 and an interlayer dialectic (ILD) 109 is further formed to cover the source/drain 105 and the seal spacer 1004 of the replacement gate 103.

In some embodiments, one or more NFET is formed within the semiconductor structure before, during, and/or after formation of the one or more PFET as a single fabrication process because formation of NFET and formation of P FET both utilize silicon and silicon germanium stacks. For example, during at least some of the processes of forming the PFET, NFET portion of the semiconductor structure are protected by a hard mask. During at least some of the processes of forming the NFET, PFET of the semiconductor are protected by a hard mask.

FIG. 18A to FIG. 25C are an n-type gate-all-around structure or an NFET during intermediate stages of manufacturing operations, in accordance with some embodiments of the present disclosure. Each intermediate stage is represented by three perspectives: a 3D perspective view, a cross sectional view dissecting along an X direction on a semiconductor fin of the NFET, and a cross sectional view dissecting in a Y direction of the NFET along dotted lines DD' of FIG. 18A. The first four operation in manufacturing the NFET is substantially identical to those in the PFET and is not repeated here for brevity.

Figure 18C:
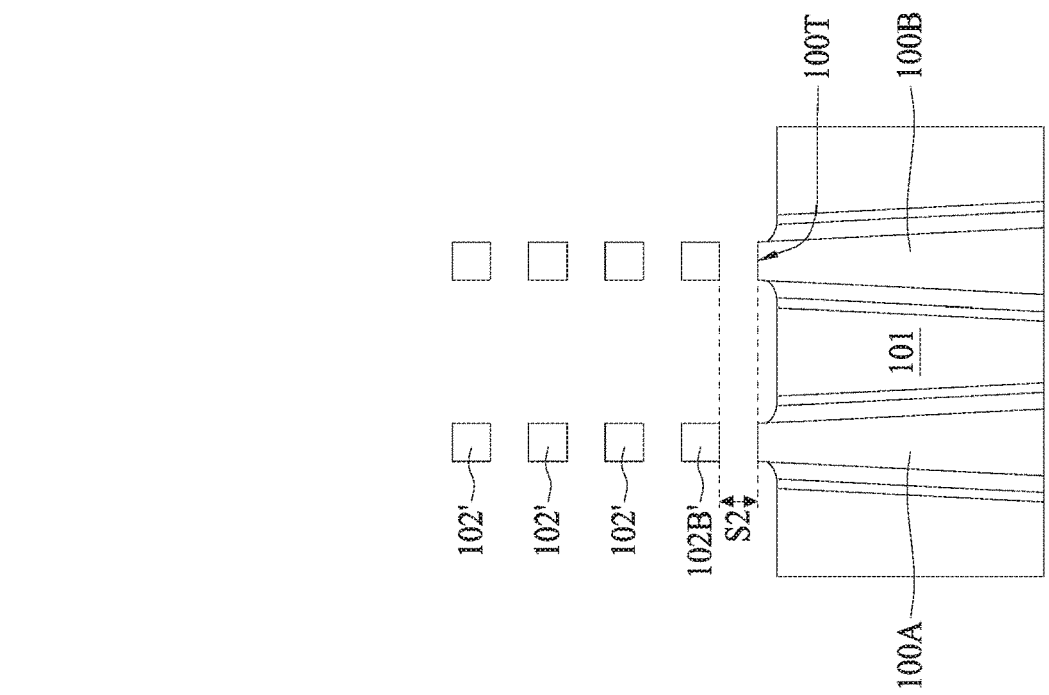
FIG. 18A to FIG. 18C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.
Figure 18B:
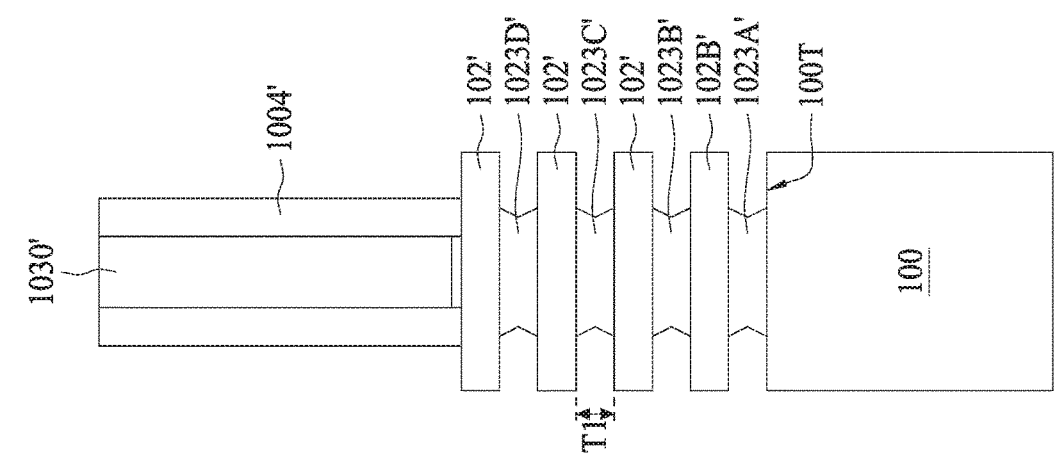
Figure 18A:
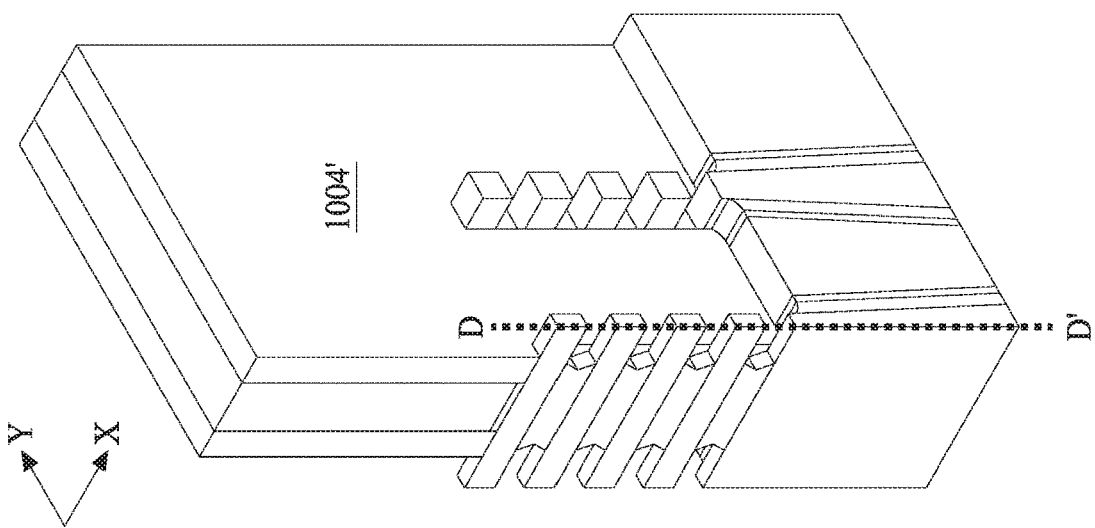

In FIG. 18A to FIG. 18C, a selective etch is performed to laterally remove the patterned silicon germanium stacks 1023A', 1023B', 1023C', and 1023D' while maintaining little to no removal of the patterned silicon stacks 1023A, 1023B, 1023C, and 1023D or the Si nanowire 102' in the final structure. In some embodiments, the selective etch stops upon the showing of faceted crystal surfaces (111) of the patterned silicon germanium stacks. As shown in FIG. 18C, a plurality of vertically stacked Si nanowires 102' are released from the patterned silicon germanium stacks 1023A', 1023B', 1023C', and 1023D' and are free standing with respect to etch other. A bottom surface of the bottom Si nanowire 102B' shows a separation S2 with the top surface 100T of the fin 100B.

In FIG. 19A to FIG. 19C, a dielectric layer 1006' is conformably formed over the sidewall of the seal spacer 1004', the sidewall of the faceted crystal surfaces (111) of the patterned silicon germanium stacks 1023A', 1023B'. 1023C', and 1023D', and surrounding the plurality of Si nanowires 102'. In some embodiments, the dielectric layer 1006 includes isolation materials, for example, low-k dielectric or silicon nitrides. The portion of the dielectric layer 1006 formed at the sidewall of the faceted crystal surfaces (111) of the patterned germanium stacks 1023A', 1023B', 1023C', and 1023D' is called inner spacer 106' in the present disclosure. The portion of the dielectric layer 1006' formed at the top surface 100T of the fins 100A, 100B or substrate 100 is called isolation layer 107' in the present disclosure. As shown in FIG. 19C, a thickness D1 of the dielectric layer 1006' initially deposited can be determined according to a spacing or thickness T1 between adjacent free standing Si nanowires 102'. In some embodiments, the thickness T1 of the dielectric layer 1006' is selected to be half of the spacing or thickness T1 in order to accommodate itself into the spacing or thickens T1. In some embodiments, the separation S2 shall be designed to be greater than the thickens T1 of the dielectric layer 1006' so as to allow the dielectric layer 1006' to enter the separation S2 and evenly cover the top surface 100T of the semiconductor fins 100A, 100B.

Figure 20C:
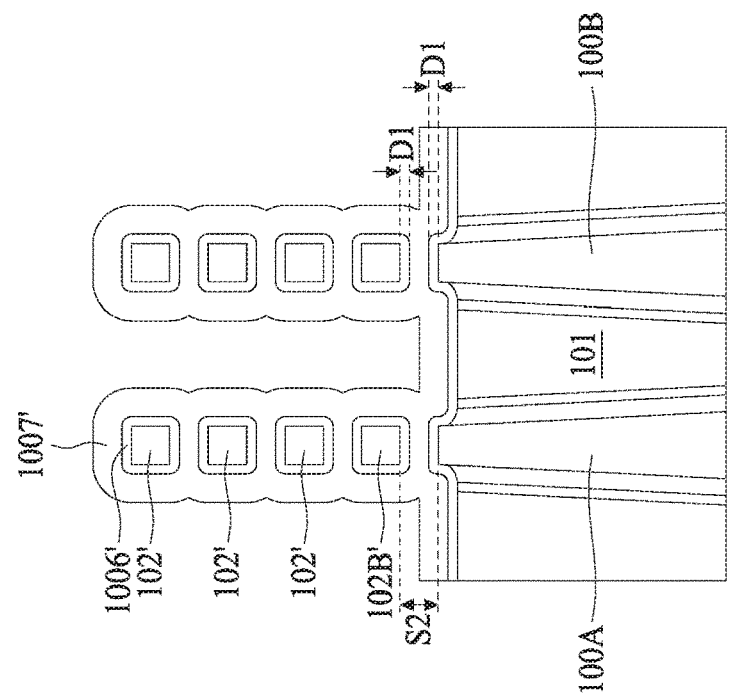
FIG. 20A to FIG. 20C are a 3D perspective view, a cross sectional view dissecting along an X direction, and a cross sectional view dissecting along a Y direction, respectively, of a gate-all-around structure during an intermediate stage of manufacturing operations, in accordance with some embodiments of the present disclosure.
Figure 20B:
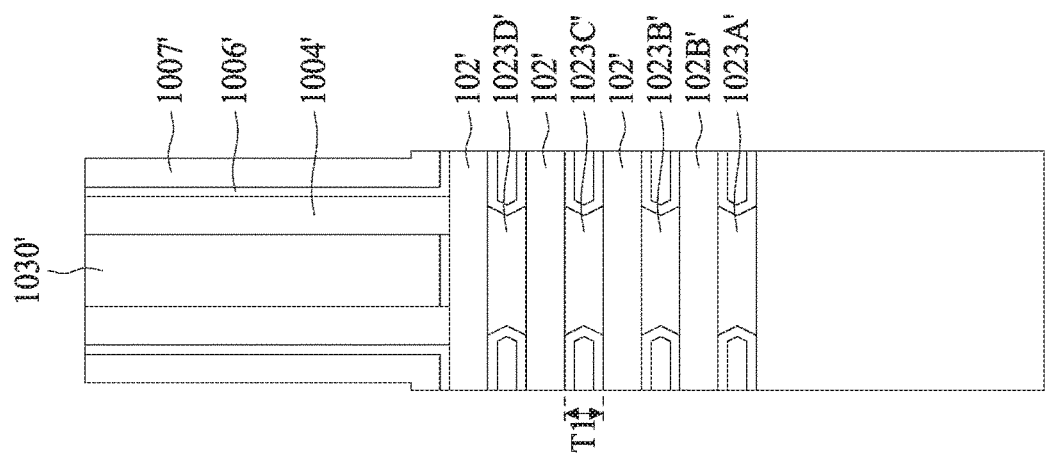
Figure 20A:
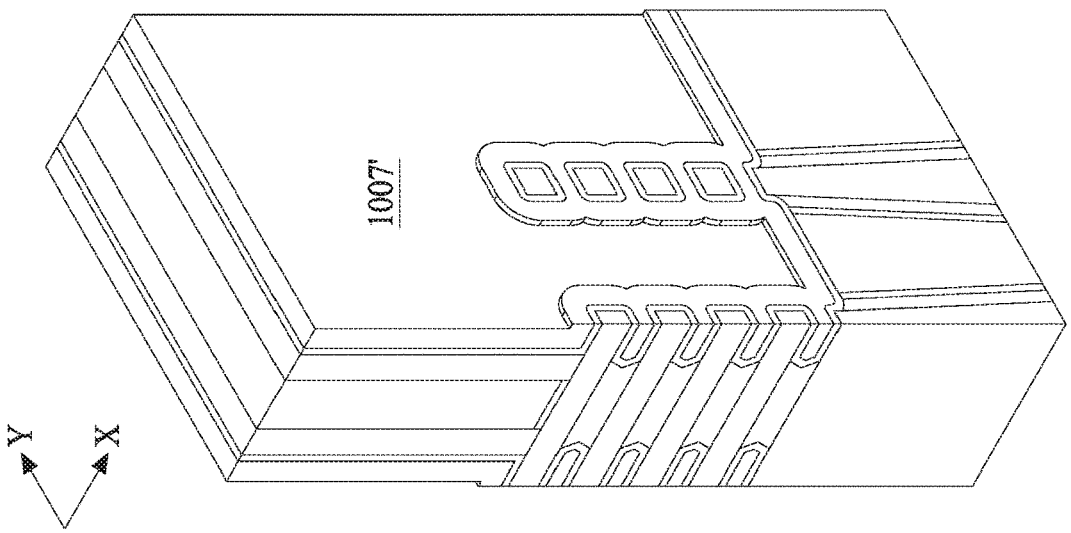

In FIG. 20A to FIG. 20C, an oxide layer 1007' is conformably formed to surround the sidewall of the dummy gate 1030', the seal spacer 1004', and the dielectric layer 1006. The oxide layer 1007' also fills the spacing or thickness T1 between adjacent free standing Si nanowires 102'. As shown in FIG. 20C, the oxide layer 1007' surrounds the plurality of the free standing Si nanowires 102' as well as the dielectric layer 1006' cover thereon in the previous operation. In some embodiments, the separation S2 is greater than 2 times of the thickens D1 of the dielectric layer 1006', as a result, the oxide layer 1007' enters the separation S2 between the top surface 100T of the semiconductor fins 100A, 100B and the bottom of the bottom Si nanowire 102B' because the separation S2 is spacious enough to accommodate 2 layers of dielectric layer 1006', one at the bottom of the bottom silicon germanium nanowire 102B', the other at the top surface 100T of the semiconductor fin 100A, 100B, as well as an extra oxide layer 1007'. Since silicon germanium is the material at the bottom of the silicon and silicon germanium stack 1023, the separation S2 of the NFET is greater than the separation S1 of the PFET counterpart previously discussed.

In FIG. 21A to FIG. 21C, an anisotropic etch is performed on the dielectric layer 1006' and the oxide layer 1007'. As shown in FIG. 21B, the sidewall of the oxide layer 1007' is partially rounded after the anisotropic etch. In FIG. 21C, the anisotropic etch is controlled to remove the oxide layer 1007' and the dielectric layer 1006' surrounding at the sidewalls of the Si nanowire 102' to an extent that a bottom spacer 1008' forms as a residual of the isotropic etch operation. The bottom spacer 1008' is composed of remaining dielectric layer 1006' between the remaining oxide layer 1007' and a sidewall of the bottom Si nanowire 102B'. A height SP' of the bottom spacer 1008B' is measured from an STI 101 top to the bottom spacer 1008B' top. In some embodiments, the bottom spacer 1008' is controlled to at least partially surround the bottom Si nanowire 102B'. Alternatively stated, if the distance CH' is measured from the STI 101 top to the bottom Si nanowire 102B' top, a difference between the distance CH' and the height SP' shall be a positive number smaller than a thickness H1 of the bottom Si nanowire 102B'.

In FIG. 22A to FIG. 22C, an isotropic etch is performed to remove a portion of the dielectric layer 1006' not in contact with the top surface 100T of the semiconductor fins 100A, 100B. As shown in FIG. 22B, the dielectric layer 1006' surrounding the Si nanowires 102', excluding the bottom Si nanowire 102B', is removed by the isotropic etch, for example, a wet etch operation which removes low-k or nitride materials. Only the dielectric layer 1006' between the top surface 100T and the bottom of the bottom Si nanowire 102B' is not removed by the isotropic etch. The aforesaid portion of the dielectric layer 1006' turns in to the isolation layer 107' in the final structure. As previously stated, the bottom spacer 1008' is controlled to at least partially surround the bottom Si nanowire 102B'. The oxide layer 1007' of the bottom spacer 1008' functions as a hardmask to the isolation layer 107' so as to prevent the complete removal of the remaining dielectric layer 1006' during the isotropic etch operation.

In FIG. 23A to FIG. 23C, the remaining oxide layer 1007' at the bottom spacer 1008' and at the sidewall of the dummy gate 1030' are removed by an oxide wet etch operation. In FIG. 24A to FIG. 24C, a source/drain 105' is formed within a first source region and a first drain region, such as through an epitaxial growth technique, to create a first source and a first drain for the silicon nanowire NFET. In some embodiments, the source/drain 105' is composed of SiP. As shown in FIG. 24C, the source/drain 105' possesses faceted boundaries as a result of limiting epitaxial growth rate in certain particular crystal directions. In FIG. 25A to FIG. 25C, a replacement gate 103' is formed to complete the NFET. After removal of the dummy gate 1030' and the patterned silicon germanium stacks 1023A', 1023B', 1023C', and 1023D', an interfacial layer material, a high-k dielectric layer, a titanium nitride capping layer, a work function metal layer, and tungsten gate metal can be formed around as well as over the plurality of Si nanowires 102'. An etch stop layer 108' and an interlayer dialectic (ILD) 109' is further formed to cover the source/drain 105' and the seal spacer 1004' of the replacement gate 103'.

Some embodiments provide a gate-all-around structure having a first transistor. The first transistor includes a semiconductor substrate having a top surface, a first nanowire over the top surface of the semiconductor substrate and between a first source and a first drain, a first gate structure around the first nanowire, an inner spacer between the first gate structure and the first source and first drain, and an isolation layer between the top surface of the semiconductor substrate and the first source and the first drain.

Some embodiments provide a semiconductor structure including a first transistor. The first transistor includes a semiconductor substrate having a top surface, a plurality of first nanowires over the top surface of the semiconductor substrate, a first source wrapping around the plurality of first nanowires, and an isolation layer in contact with the top surface of the semiconductor substrate. The isolation layer is separating a bottom nanowire of the plurality of first nanowires from the top surface of the semiconductor substrate.

Some embodiments provide a method for manufacturing a semiconductor structure, including (1) forming a first nanowire material and second nanowire material stack over a substrate; (2) patterning the first nanowire material and second nanowire material stack and the substrate to form semiconductor fins separated from each other by an isolation; (3) forming a dummy gate orthogonally over the semiconductor fins; (4) selectively removing the first nanowire material not covered by the dummy gate thereby defining a second nanowire; (5) conformably depositing a dielectric over the first nanowire material covered by the dummy gate and over the second nanowire; (6) forming an oxide layer covering the dielectric; and (7) anisotropically etching the dielectric and the oxide layer thereby forming a bottom spacer composed of remaining dielectric and remaining oxide layer after the etching.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A gate-all-around structure, comprising:
   a first transistor, comprising:
   a semiconductor substrate having a top surface;
   a first fin extended from the semiconductor substrate;
   a first nanostructure over the first fin and between a first source and a first drain, wherein the first source and the first drain are at longitudinal ends of the first nanostructure, and the first nanostructure extends above an isolation structure;
   a first gate structure around the first nanostructure;
   an inner spacer between the first gate structure and the first source; and
   an isolation layer between the top surface of the semiconductor substrate and the first source and the first drain, wherein the isolation layer is in direct contact with an extended top surface of the first fin, and
   wherein the inner spacer and the isolation layer are composed of same material, and
   wherein the isolation layer is in contact with the inner spacer.

2. The structure of claim 1, wherein the isolation layer is in contact with the first nanostructure.

3. The structure of claim 2, wherein a distance between the top surface of the semiconductor substrate and a bottom of the first nanostructure is greater than a thickness of the inner spacer.

4. The structure of claim 2, wherein the first nanostructure comprises silicon germanium nanostructure.

5. The structure of claim 1, wherein the isolation layer is in contact with the first source and the first drain.

6. The structure of claim 5, wherein the first nanostructure comprises silicon nanostructure.

7. The structure of claim 1, further comprising:
a second transistor, comprising:
  a second nanostructure over the top surface of the substrate and between a second source and a second drain;
  a second gate structure around the second nanostructure,
  wherein the first nanostructure and the second nanostructure are configured to allow carriers of opposite conductivity types to pass.

8. A semiconductor structure, comprising:
a transistor, comprising:
  a semiconductor substrate having a top surface;
  a plurality of nanostructures stacked over the top surface of the semiconductor substrate and extended above an isolation structure;
  a source wrapping around the plurality of nanostructures at a longitudinal end of the plurality of nanostructures;
  an inner spacer sandwiched between the each of the plurality of nanostructures and the source; and
  an isolation layer in contact with the top surface of the semiconductor substrate,
  wherein the isolation layer is lower than a bottom nanostructure of the plurality of nanostructures and higher than a top surface of the isolation structure, and the isolation layer is in contact with the bottom nanostructure of the plurality of nanostructures and the top surface of the semiconductor substrate, and
  wherein the isolation layer is in contact with the inner spacer.

9. The semiconductor structure of claim 8, wherein the source is separating the bottom nanostructure of the plurality of nanostructures and the isolation layer.

10. The semiconductor structure of claim 8, wherein a distance between the top surface of the semiconductor substrate and the bottom nanostructure is greater than a thickness of the inner spacer.

11. A transistor structure, comprising:
a semiconductor substrate having a top surface;
a fin structure extended from the semiconductor substrate;
a liner formed on a sidewall of the fin structure;
a plurality of nanostructures stacked over the top surface of the semiconductor substrate;
a source wrapping around the plurality of nanostructures at a longitudinal end of the plurality of nanostructures;
an inner spacer sandwiched between the each of the plurality of nanostructures and the source; and
an isolation layer in contact with the top surface of the semiconductor substrate and the liner,
wherein the isolation layer is separating a bottom nanostructure of the plurality of nanostructures from the top surface of the semiconductor substrate, and
wherein the isolation layer is in contact with the inner spacer.

12. The transistor structure of claim 11, wherein a distance between the top surface of the semiconductor substrate and the bottom nanostructure is greater than a thickness of the inner spacer.

13. The transistor structure of claim 11, wherein the source is separating the bottom nanostructure of the plurality of nanostructures and the isolation layer.

14. The transistor structure of claim 1, wherein the isolation layer is higher than a top surface of the isolation structure.

15. The transistor structure of claim 8, further comprising:
a fin structure extended above the isolation structure; and
a liner formed on a sidewall of the fin structure, wherein the isolation layer is in direct contact with the liner.

16. The transistor structure of claim 11, further comprising:
an etch stop layer formed on the source, wherein the isolation layer is in direct contact with the etch stop layer.

17. The transistor structure of claim 1, further comprising:
a liner formed on a sidewall of the first fin, wherein the isolation layer is in direct contact with the liner.

18. The transistor structure of claim 1, wherein the inner spacer has a C-shaped structure with a recessed central portion, and a portion of the source is embedded in the recessed central portion.

19. The transistor structure of claim 8, wherein the inner spacer has a C-shaped structure with a recessed central portion, and a portion of the source is embedded in the recessed central portion.

20. The transistor structure of claim 11, wherein the inner spacer has a C-shaped structure with a recessed central portion, and a portion of the first source is embedded in the recessed central portion.

* * * * *